US008794930B2

(12) United States Patent
Sanchez et al.

(10) Patent No.: US 8,794,930 B2
(45) Date of Patent: Aug. 5, 2014

(54) NANOMOLECULAR SOLID STATE ELECTRODYNAMIC THRUSTER

(75) Inventors: Jason D. Sanchez, San Antonio, TX (US); Piotr A. Garbuz, New York, NY (US); Andrew D. Zonenberg, Troy, NY (US)

(73) Assignee: Game Changers, LLC, New York, NY (US)

( * ) Notice: Subject to any disclaimer, the term of this patent is extended or adjusted under 35 U.S.C. 154(b) by 103 days.

(21) Appl. No.: 13/410,798

(22) Filed: Mar. 2, 2012

(65) Prior Publication Data
US 2012/0237364 A1 Sep. 20, 2012

Related U.S. Application Data

(63) Continuation of application No. PCT/US2010/002428, filed on Sep. 3, 2010.

(60) Provisional application No. 61/239,446, filed on Sep. 3, 2009, provisional application No. 61/264,778, filed on Nov. 27, 2009, provisional application No. 61/296,198, filed on Jan. 19, 2010.

(51) Int. Cl.
F04B 19/24 (2006.01)
F02C 1/04 (2006.01)
F02G 1/00 (2006.01)

(52) U.S. Cl.
USPC .............................. 417/207; 60/650

(58) Field of Classification Search
USPC ....................... 417/53, 207; 60/650
See application file for complete search history.

(56) References Cited

U.S. PATENT DOCUMENTS

| 4,802,333 | A | 2/1989 | Smith |
| 7,137,339 | B2 | 11/2006 | Bierwirth et al. |
| 2004/0202554 | A1* | 10/2004 | Takeuchi et al. ............... 417/322 |
| 2006/0001569 | A1* | 1/2006 | Scandurra ..................... 342/351 |

FOREIGN PATENT DOCUMENTS

| CN | 1487236 A | 4/2004 |
| WO | WO 01/09063 A2 | 2/2001 |
| WO | WO 02/095207 A1 | 11/2002 |

OTHER PUBLICATIONS

Office Action (First Office Action) issued on Nov. 22, 2013, by the State Intellectual Property Office of People's Republic of China in corresponding Chinese Patent Application No. 201080049375.7, and an English Translation of the Office Action. (11 pages).
International Search Report (PCT/ISA/210) issued on Apr. 14, 2011 for International Application No. PCT/US2010/002428.

* cited by examiner

Primary Examiner — Bryan Lettman
(74) Attorney, Agent, or Firm — Buchanan Ingersoll & Rooney

(57) ABSTRACT

A solid-state device that is capable of imparting a directional momentum via thermoelectric microelements. High surface area is used to enhance the efficiency of heat transfer. The device can be operated in adiabatic mode in order to minimize thermal emissions. The thermoelectric microelements include at least a hot layer and a cold layer arranged in a stack and means for heating and/or cooling the hot and cold layers so that the cold layer has a lower temperature than the hot layer; and at least one through hole in the stack wherein an entire length of the through hole is up to 10 times of a mean free path of a gas in which the device is immersed and/or is not greater than 1500 nm.

21 Claims, 16 Drawing Sheets

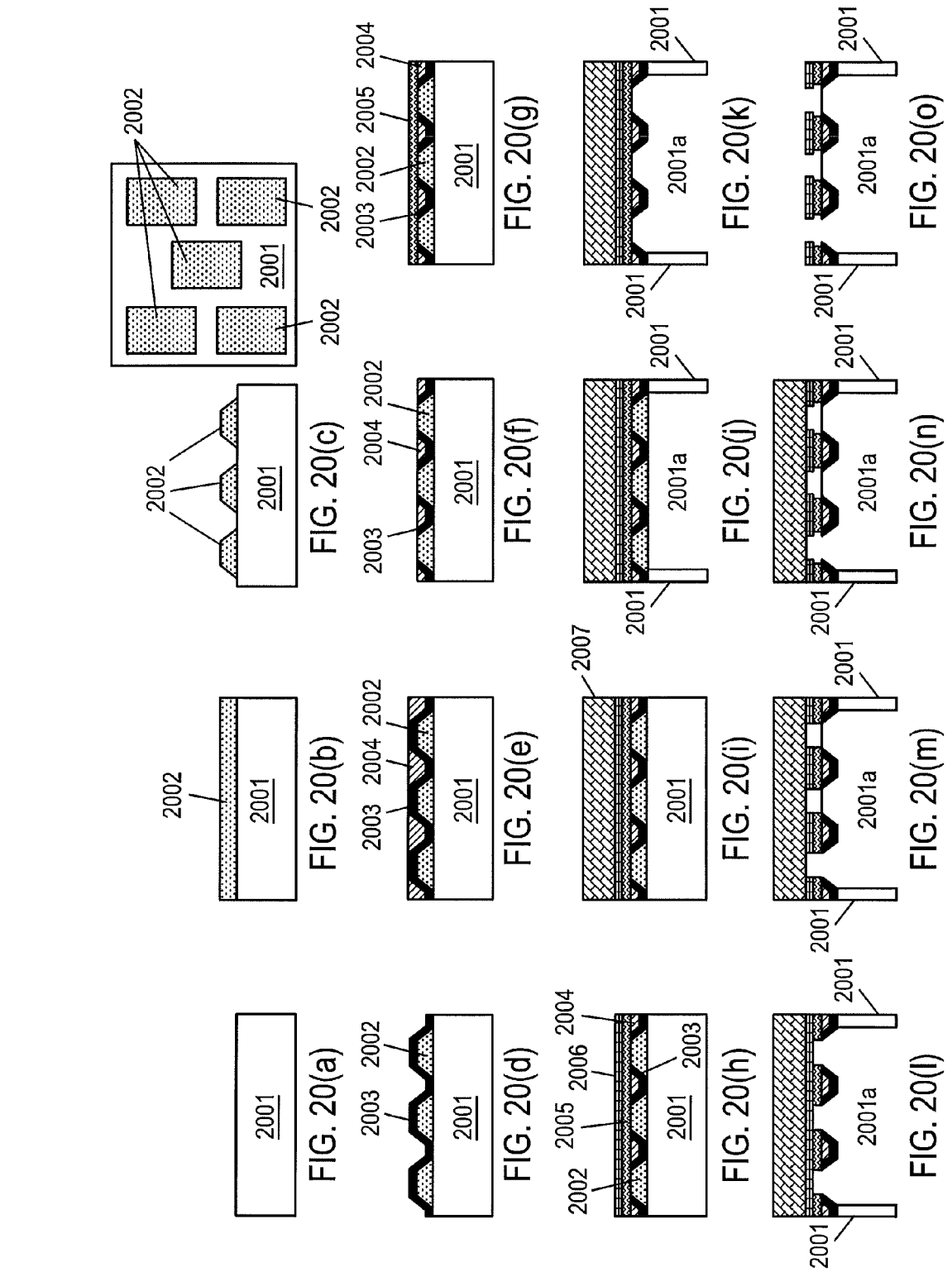

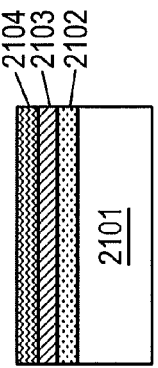
FIG. 21(a)
FIG. 21(b)
FIG. 21(c)
FIG. 21(d)
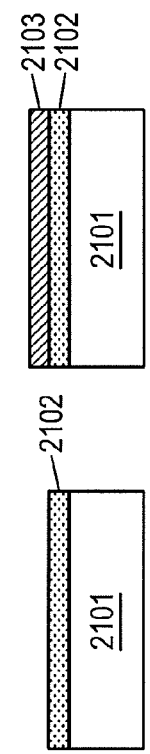
FIG. 21(e)
FIG. 21(f)
FIG. 21(g)
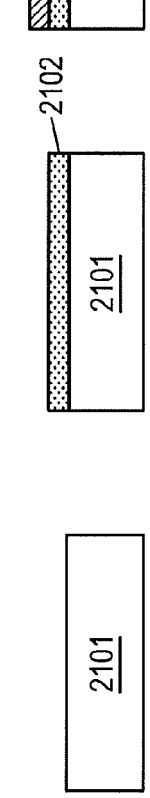
FIG. 21(h)
FIG. 21(i)

US 8,794,930 B2

NANOMOLECULAR SOLID STATE ELECTRODYNAMIC THRUSTER

CROSS REFERENCE

This application is related, and contains references, to U.S. Provisional Application Nos. 61/239,446, filed Sep. 3, 2009, 61/264,778, filed Nov. 27, 2009, and 61/296,198, filed Jan. 19, 2010, and PCT International Application No. US2010/002428, filed Sep. 3, 2010, the entire contents of which are hereby incorporated by reference herein.

TECHNICAL FIELD

The present disclosure relates to methods and apparatus for causing the movement of fluids, for example gases, which may be applied to propulsion systems, vacuum generation, gas compression, and other uses.

BACKGROUND

Devices for the movement of gases are widely utilized. The very first aircraft engines were piston driven propellers. They worked by coupling a piston engine to a propeller. Their simplicity lead to widespread adoption until jet engines were invented. Turbojet engines work by the principle of coupling a turbine to a fuel combination system. Spinning of the turbine compresses a fuel-air mixture which, when burned, provides thrust and torque to rotate the turbine. The first turbojet engines derived their thrust from exhaust leaving the engines. Modern variants of the turbojet engines include turbo prop and turbofan engines, which use torque generated by the exhaust to drive a propeller or fan in addition to compressing the fuel-air mixture. Rocket engines are possibly one of the oldest mechanical propulsion systems, and have not changed much since their inception. A rocket comprises a tube or cone in which sits (or into which is fed) a fuel oxidizer mixture. Expanding gas from combustion of this mixture creates thrust. Rockets, while offering the highest fuel-thrust ratio of any existing propulsion systems, cannot easily vary the amount of thrust they generate. Even adding an ability to turn a rocket on or off significantly complicates its design.

Adhesion between two materials may be characterized into five types: mechanical, chemical, dispersive, electrostatic, and diffusive. Out of these five types, so far, only electrostatic and certain types of mechanical adhesion are easily reversible processes. Vacuum may be used to adhere surfaces and lift materials. However, such devices generally require separate mechanisms for generating a reduced pressure and applying the vacuum to a surface. A vacuum generating system will generally include a vacuum pump, control valve, air filter, vacuum gauge, vacuum reserve tank and power source. A benefit of using vacuum for adhesion, however, is that no residue is left. Typically, the other types of adhesion will usually leave behind a residue that is often undesired.

Generally, the conventional propulsion systems mentioned above can also be used to compress gas. It is also possible to compress gas via the ideal gas law, such as in piston or diaphragm pumps. Current devices generally require pumping apparatuses separate from a pressurized vessel.

The ability of temperature differential to drive gas flow at a surface has long been known. In 1873, Sir William Crookes developed a radiometer for measuring radiant energy of heat and light. Today, Crookes's radiometer is often sold as a novelty in museum stores. It consists of four vanes, each of which is blackened on one side and light on the other. These are attached to a rotor that can turn with very little friction. The mechanism is encased inside a clear glass bulb with most, but not all, of the air removed. When light falls on the vanes, the vanes turn with the black surfaces apparently being pushed by the light.

Crookes initially explained that light radiation caused a pressure on the black sides to turn the vanes. His paper was refereed by James Clerk Maxwell, who accepted the explanation as it seemed to agree with his theories of electromagnetism. However, light falling on the black side of the vanes is absorbed, while light falling on the silver side is reflected. This would put twice as much radiation pressure on the light side as on the black, meaning that the mill is turning the wrong way for Crooke's initial explanation to be correct. Other incorrect explanations were subsequently proposed, some of which persist today. One suggestion was that the gas in the bulb would be heated more by radiation absorbed on the black side than the light side. The pressure of the warmer gas was proposed to push the dark side of the vanes. However, after a more thorough analysis Maxwell showed that there could be no net force from this effect, just a steady flow of heat across the vanes. Another incorrect explanation that is widely put forward even today is that the faster motion of hot molecules on the black side of the vane provide the push.

The correct explanation for the action of Crookes radiometer derives from work that Osborne Reynolds submitted to the Royal Society in early 1879. He described the flow of gas through porous plates caused by a temperature difference on opposing sides of the plates which he called "thermal transpiration." Gas at uniform pressure flows through a porous plate from cold to hot. If the plates cannot move, equilibrium is reached when the ratio of pressures on either side is the square root of the ratio of absolute temperatures. Reynold's paper also discussed Crookes radiometer. Consider the edges of the radiometer vanes. The edge of the warmer side imparts a higher force to obliquely striking gas molecules than the cold edge. This effect causes gas to move across the temperature gradient at the edge surface. The vane moves away from the heated gas and towards the cooler gas, with the gas passing around the edge of the vanes in the opposite direction. Maxwell also refereed Reynolds' paper, which prompted him to write own paper, "On stresses in rarefied gases arising from inequalities of temperature." Maxwell's paper, which both credited and criticized Reynolds, was published in the Philosophical Transactions of the Royal Society in late 1879, appearing prior to the publication of Reynold's paper. See, Philip Gibbs in "The Physics and Relativity FAQ," 2006, at math.ucr.edu/home/baez/physics/General/LightMill/lightmill.html.

Despite the descriptions by Reynolds and Maxwell of thermally driven gas flow on a surface dating from the late 19th century, the potential for movement of gases by interaction with hot and cold surfaces has not been fully realized. Operation of a Crookes radiometer requires rarefied gas (i.e. a gas whose pressure is much less than atmospheric pressure), and the flow of gas through porous plates does not yield usable thrust, partially due to the thickness and due to the random arrangement of pores in the porous plates.

SUMMARY

An apparatus operable to propel a gas is described. In some embodiments, the apparatus comprises a plurality of layers arranged in a stack and a means of heating and/or cooling adjacent layers to form alternating hot and cold layers, and at least one through hole in the stack. In some embodiments, each hot layer is hotter than the immediately adjacent cold layers and each cold layer is colder than the immediately adjacent hot layers. A surface of each hot layer is exposed in an interior of the through hole, and a surface of each cold layer is exposed in the interior of the through hole.

In other embodiments, the apparatus comprises at least a first and second layer and a means of heating and/or cooling adjacent layers to form alternating hot and cold layers, and at least one hole through the hot and cold layers. Preferably, each hot layer has a chamfer facing inward and in a first direction. An angle between the chamfer of each hot layer and a center axis of the through hole is designated $\theta_2$. Also preferably, each cold layer has a chamfer facing inward and in a second direction opposed to the first direction. An angle between the chamfer of each cold layer and the center axis of the through hole is designated $\theta_1$. In some embodiments, the sum of $\theta_1$ and $\theta_2$ falls in the range from about 85° to 95°.

BRIEF DESCRIPTION OF THE DRAWINGS

The present methods, devices and systems will now be described by way of exemplary embodiments to which the invention defined by the claims appended hereto are not limited. The details of one or more embodiments of the disclosure are set forth in the accompany drawings and the description below. Other features, objects, and advantages will be apparent from the description and the drawings, and from the claims.

FIG. 20 shows an exemplary method of manufacturing NMSET.

FIG. 21 shows another exemplary method of manufacturing NMSET.

DETAILED DESCRIPTION

Overview

Figure 1:
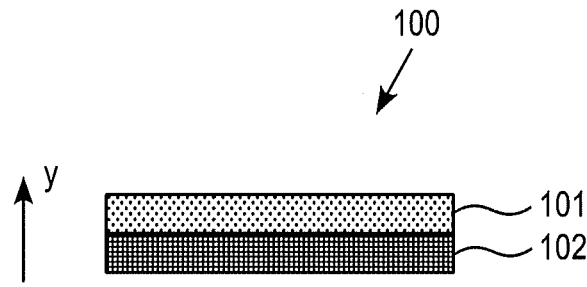
FIG. 1 shows a heat pump. This can be a Peltier slab, a slab driven by thermionic emission, or any other suitable means.

In preferred embodiments, one example of distributed thrusters, is an apparatus described herein that may be referred to as a Nano Molecular Solid-state Electrodynamic Thruster ("NMSET"). The basis of operation of NMSET makes it possible to apply NMSET in the fields of, for example, propulsion, adhesion, compression and refrigeration, depending on the manner in which an NMSET is employed. In preferred embodiments, NMSET and related distributed thrusters devices provide lightweight, compact, energy-efficient creation of a gas pressure differential with adjustable flow velocity.

Propulsion

In some embodiments, distributed thrusters such as NMSET can offer one or more of the following improvements in the field of gas propulsion:

1. Improved Resiliency: Damage to any area in a conventional gas propulsion system would probably lead to system-wide failure. Distributed thrusters provide enhanced redundancy and robustness.

2. Lightweight: Electrically driven distributed thrusters, may make use of photovoltaic thin films, in which case fuel load vanishes. Furthermore since each thruster in a distributed thrusters system creates a local gas pressure difference, this local effect may require fewer and or lighter apparatuses to maintain the structural integrity of such gas propulsion system, than what would be normally required in a non-distributed gas propulsion system that generates the same gas flow volume.

3. Scalability: Conventional gas propulsion systems cannot be easily scaled: optimal turbojets for small aircrafts are not scale reductions of optimal turbojets for large aircrafts. Distributed thrusters are easier to scale as scaling primarily changes the quantity of thrusters while leaving the individual thruster dimensions mostly intact.

4. Response Time: Less massive thrust producing devices spool up and down faster; as such, thrust from a distributed thruster gas propulsion system can be more easily adjusted in response to changes of need.

5. Power Independence: Most conventional propulsion systems require a specific type or class of fuels in order to operate, whereas some embodiments of distributed thrusters, such as, for example, NMSET, only requires a source of temperature differential, which can generated by electricity.

6. Green Propulsion: Some embodiments of distributed thrusters, such as several embodiments of NMSET, expect an electrical input and as such, do not require fossil fuels to operate; therefore they do not produce polluting exhaust (e.g. carbon monoxide, nitrogen oxide) during ordinary operation when they use a non-polluting method of generating the required electrical currents.

Adhesion

In some embodiments, distributed thrusters, such as, for example, NMSET, may be used as a lightweight mechanical adhesive that adheres to a surface through suction. The process can be reversible, as the only step required to reverse the adhesion is to cut power to the system in some embodiments. Using such a system can provide further benefit over electrostatic adhesion in that such a system does not require a material to be adhered to be flat or conductive, and does not leave behind residue. Compared to other mechanical adhesion processes, using such a system may not require a surface being adhered to be pretreated.

Gas Compression

Because distributed thrusters, such as, for example, NMSET, can be arranged to drive gas flow through a surface, all or part of a pressurized vessel may function to provide gas compression. Thus, in some arrangements, separated pumping and pressurized containment may not be required. Moreover, because, the action of such a system generally occurs over a short distance, it is possible, in some embodiments, to use such a system as a highly compact compressor by stacking multiple stages of distributed thrusters. Conventional gas propulsion systems generally operate over length scales of centimeters and sometimes meters. Thus, stacking conventional propulsion systems tends to be a complex and expensive proposition. By contrast, distributed thrusters can be packaged to operate over smaller scales, down to, for example, micrometers. Furthermore, the versatility of such systems means that such a system can be readily adapted to function as a high-pressure pump, a standard atmospheric pump, or with a sufficient number of stages, as a high vacuum pump.

NMSET Design

In one aspect and embodiment, NMSET and some related devices described here may be thought of as functioning by reducing entropy in gas in contact with the system. Optionally, such device may add energy, in addition to the energy lost through inefficiencies in the system, e.g. thermal energy, to the gas. In another aspect and embodiment, the geometry of NMSET and some related devices can affect gas flow direction and convenience of use. Several embodiments of NMSET and some related devices may be further distinguished from previous thermal transpiration devices and the like by the combined application of scale parameters, materials having advantageous molecular reflection properties, geometries, design, construction and arrangement of elements that provide significant increase in efficiency, and or capabilities to operate at higher ambient pressures and/or produce higher flow rates. Described herein are various exemplary embodiments of NMSET with discussion of these and other parameters that, in preferred embodiments, can create a strong gas flow in a particular direction with minimal thermodynamic loss, and or operate at higher ambient pressures and or produce higher flow rates.

Reduction of entropy in a gas by NMSET may be represented by a transformation A in the momentum space k of the gas. A can be expressed in a matrix once a set of suitable bases is chosen for the momentum space k. If the expectation value of the transformed momentum space Ak is nonzero, the NMSET receives a net momentum in the opposite direction of the expectation value due to the conservation of momentum.

The geometry of NMSET may be optimized for more efficient functioning. The geometry of NMSET affects the transformation matrix A. A geometry that produces a matrix A essentially equal to an identity matrix 1 does not create a net momentum bias (i.e. will not make the transformed momentum space Ak have a nonzero expectation value). Rather, gas vortexes may be generated. Geometries that result in larger eigenvalues of A tend to imply a more efficient function, e.g., that more momentum is carried by gas particles moving in a particular direction.

As an example, consider a heat pump 100 immersed in a gas, shown in FIG. 1. The heat pump 100 comprises an upper layer 101 and a lower layer 102. For simplicity, a Cartesian coordinate system can be referenced with a y-axis pointing from the lower layer 102 to the upper layer 101. A temperature differential can be established by a Peltier device (not shown) between the layers or any suitable means such that the upper layer 101 is colder than the gas and the lower layer 102 is hotter than the gas. For sake of simplicity, one may assume that the heat pump 100 has 100% Carnot cycle efficiency. However, other efficiencies are contemplated. In this case, the heat pump 100 will not transfer net heat into the gas. Transformation caused by the heat pump 100 to the momentum space k of the gas can be expressed by a Hermetian matrix A. When a gas particle (molecule or atom) collides with the lower layer 102, assuming the collision is diabatic, the gas particle rebounds off at a higher velocity than before the collision. When a gas particle collides with the upper layer 101, assuming the collision is diabatic, the gas particle rebounds off the upper layer 101 at a reduced velocity than before the collision. The heat pump 100 feels a net force in the y direction. In other words, the lower layer 102 heats and thus increases pressure of the gas below the lower layer 102, while the upper layer 101 cools and thus decreases the pressure of the gas above the upper layer 101. The pressure difference exerts a force on the heat pump 100 in the y direction. In terms of transformation of the momentum space k of the gas, as gas particles rebounding from the upper layer 101 leave with less momentum than gas particles rebounding from the lower layer 102, the transformed momentum space Ak becomes skewed preferentially in the −y direction, i.e., the expectation value p of the transformed momentum space Ak is nonzero and points to the −y direction. Assuming the gas and the heat pump 100 compose a closed system (i.e., no interaction with other objects), the heat pump 100 gains a momentum −p to conserve the total momentum of the closed system.

Figure 2:
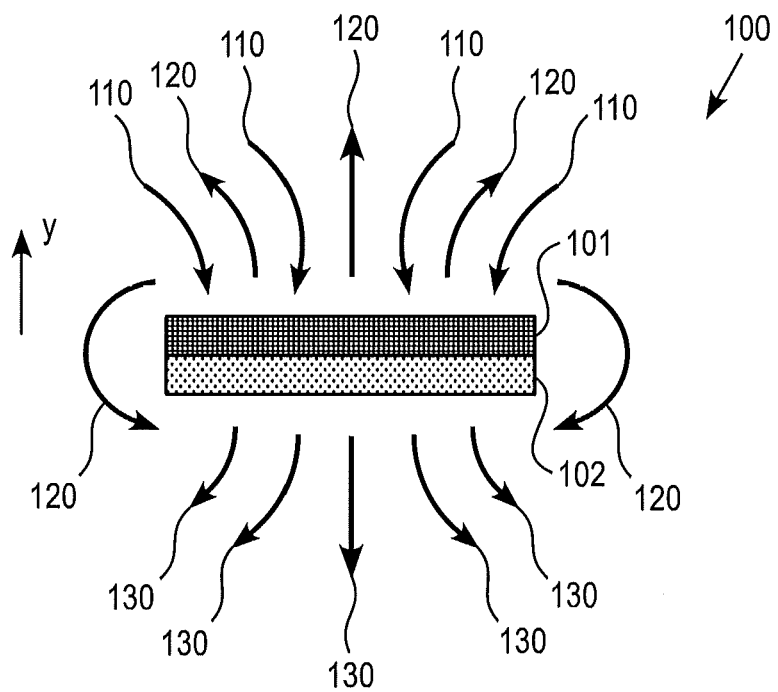
FIG. 2 shows gas flow patterns around the heat pump of FIG. 1.

While the geometry of the heat pump 100 in FIG. 1 does generate a direction force, in certain circumstances it may not be practical for the following reasons:

1. If the heat pump 100 is large, translational motion of the heat pump 100 along the y direction forces the gas to flow all the way around edges of the heat pump.
2. The vast majority of the heat is transferred from surfaces of the heat pump 100 via gas convection.
3. Gas near the surfaces has an insulating effect. Momentum transfer between the heat pump 100 and the gas is not efficient except in proximity of the edges of the slab, as shown in FIG. 2.
4. Surface area of the heat pump 100 is surface area of its convex hull.

These problems all relate to a single core issue, very little of the gas has any direct surface contact. Thus, a more complex geometry can be advantageous. Exemplary embodiments with three different geometries are described herein.

Principles of Operation

Although many different geometries of NMSET or related devices are possible, the principle of operation of NMSET remains the same. While not wanting to be limited to any particular theory, operation uses energy to reduce entropy on some device surfaces and transfer reduced entropy to a gas in contact with the surface. The device can optionally donate energy to the gas by raising the gas temperature. The function of NMSET may be therefore divided into three areas: the means by which entropy on surfaces of the device is reduced, the means by which the reduced entropy is transferred to the gas, and the optional means other than the inefficiency of the Carnot cycle of the heat pump by which the gas temperature is increased.

Temperature Differential

A temperature differential between layers of material or more precisely, between two opposing surfaces is generally required for NMSET or related device to operate. In preferred embodiments described herein, a temperature differential can be established in a solid-state electrodynamic mechanism, i.e., the "SE" of NMSET. However, the devices and methods described here are not limited to electronic or purely solid state devices. For example, a temperature differential may be established by conduction of heat from combustion using a fluid coolant, exothermic chemical reaction, or other chemical source. A temperature differential may be established by simple resistive heating, by the Peltier effect, by thermionic emission, by the thermo-tunneling enhanced Peltier effect, or by any other suitable means, such as explained below. A means by which the temperature differential is established between two objects can be phenomenologically described by two characteristics: entropy-reduction (heat transfer between the two objects), and diabaticity (total heat transfer between environment and the two objects).

In one embodiment, the Peltier effect can be used to establish a temperature differential. The Peltier effect occurs when an electric current is applied through a loop composed of two materials with different Peltier coefficients joined at two junctions. Depending on the direction of the electric current, heat flows from one junction to the other, causing a temperature differential to be established between the junctions. The Peltier effect can be understood as follows: Heat capacity of charge carriers in a material is characterized by the Peltier coefficient $\Pi$, which is the amount of heat carried per unit charge carriers in the material. When an electric current 1 flows through a junction of material A with Peltier coefficients $\Pi_A$ and material B with Peltier coefficient $\Pi_B$, the amount heat carried by charge carriers to the junction in a unit time is $1 \times (\Pi_A - \Pi_B)$.

An ideal Peltier effect reduces entropy locally and is adiabatic. Assuming Joule heating and or Carnot cycle inefficiencies can be ignored, in the Peltier effect, heat is transferred from one junction to another, but no heat is added into the loop of the two materials. This entropy reduction can provide for advantages in the stackability of NMSET and related devices. Consequently, the Peltier effect lends itself particularly well to some embodiments.

In this embodiment, a power source drives an electric current between two surfaces. Charge carriers such as electrons and/or holes carry heat as they flow in the electric current, and thus create a temperature differential between the two surfaces. Entropy is reduced as the temperature differential is established.

Phonon flow reduces the temperature differential established by the Peltier effect. If phonons are permitted to flow freely (i.e., infinite thermal conductivity or zero heat capacity), their flow will cancel the temperature differential established by the Peltier effect. Efficiency of the Peltier effect can be increased by reducing electrical resistance and thermal conductance.

Figure 6:
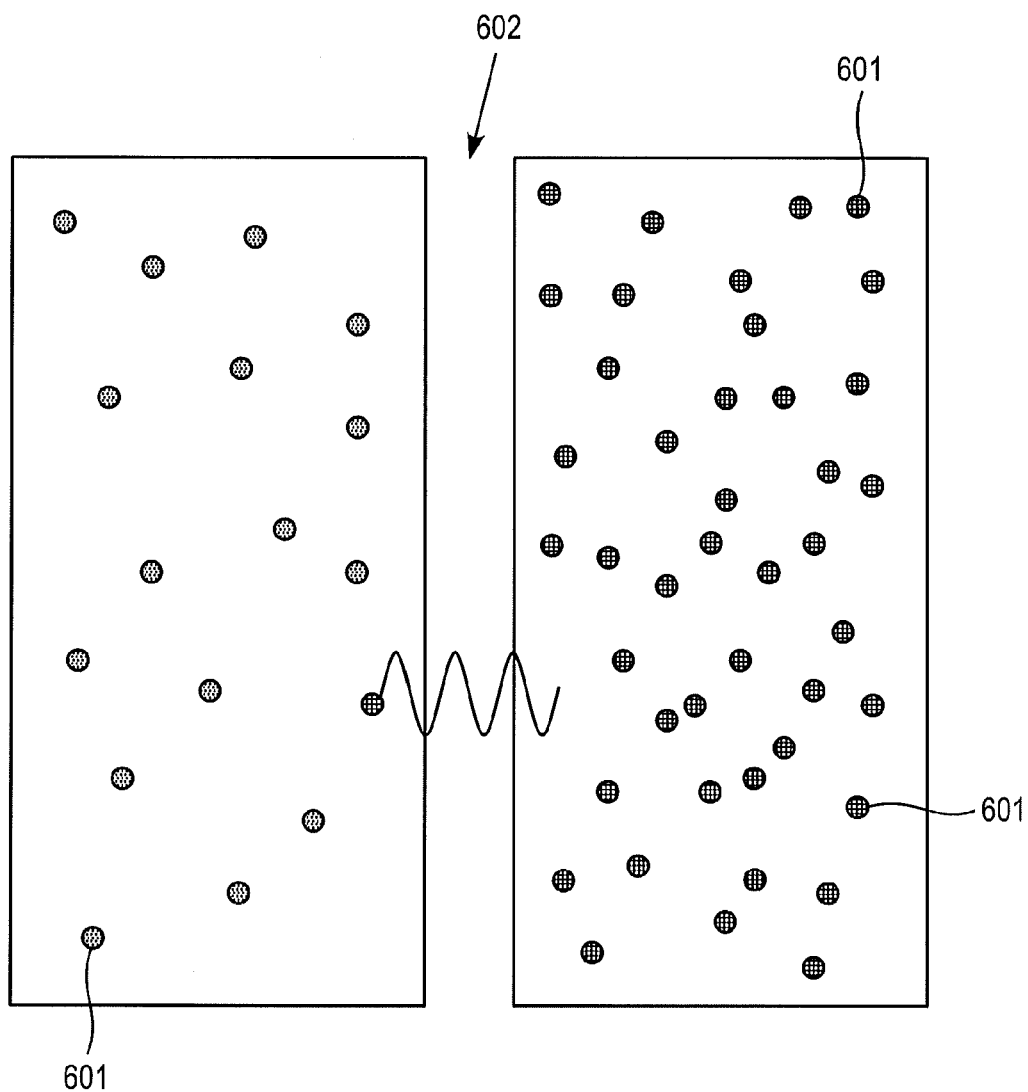
FIG. 6 shows the thermo-tunneling enhanced Peltier effect.

One way to reduce thermal conductance is to place a narrow vacuum gap in the path of the electric current. Phonons cannot easily pass the vacuum gap but charge carriers can do so under a voltage across the vacuum gap. This is called thermo-tunneling enhanced Peltier effect (or thermotunnel cooling). FIG. 6 shows a diagram of the thermo-tunneling enhanced Peltier effect. Charge carriers 601 can tunnel through a vacuum gap 602.

The thermo-tunneling enhanced Peltier effect is generally only significant at high temperatures or voltages, unless enhanced by choice of surface geometry and materials that can restrict behavior of charge carriers near the vacuum gap and increase tunneling probability. For example, suitable surface coatings and structures can function as a filter that do not allow low energy states of charge carriers but only high energy states of charge carriers near the vacuum gap.

In another embodiment, a temperature differential can be created and maintained by field-enhanced thermionic emission. Thermionic emission is a heat-induced flow of charge carriers over a potential-energy barrier. The charge carriers can be electrons or ions (i.e., thermions). In a simple approximation, the potential-energy barrier acts like a dam, in that it withholds carriers with thermal energy less than its height and allows carriers with thermal energy greater than its height to flow over. When the overflowing carriers pass the potential-energy barrier, heat is carried away with them. The carriers left behind the potential-energy barrier re-thermalize (redistribute in energy) to a lower temperature. Thermionic emission typically requires an operating temperature of several hundred degrees Celsius so that a non-negligible fraction of the carriers has thermal energies great enough to overcome the potential-energy barrier. An electrical field can assist thermionic emission by reducing the height of the potential-energy barrier and reducing the required operating temperature.

A temperature differential in NMSET or related device can also be established by using resistive heating (explained below) and/or by suitable chemical processes. In order to maintain the temperature differential without raising the overall temperature of the device, some cooling means can also be provided, such as a heat sink exposed to atmosphere. No matter what cooling means is used, the temperature differential is more pronounced if warmer surfaces of the device are not cooled as efficiently as cooler surfaces, which can be achieved, for example, by thermal insulation.

Force Generation

In one aspect, the production of net thrust may be thought of as the transfer of the reduced entropy from an established temperature differential to a gas. Without wishing to be bound by theory, consider a single device operating in a gas, as an adiabatic process. In this example, a temperature differential between a hot and a cold layer can be established by a suitable means such as the Peltier effect. For simplicity, assume no net heat transfer between the gas and the device. Particles of the gas will impact the hot and cold layers with equal probabilities, and their interaction with these layers will have consequences on local momentum space of the gas near surfaces of the hot and cold layers. The local momentum space of the gas very close to a surface of the hot and cold layers has nonzero expectation value when the gas and the surface have different temperatures. Assuming also that no gas particles penetrate the surface, the gas particles rebound from the surface with momenta different from their incident momenta, which skews the momentum space along the surface normal, and the magnitude of the skew is directly related to the temperature difference between the surface and the gas.

In an arrangement with random geometry (i.e. surface normals at different surface locations point to random directions), the weighted sum of expectation values of local momentum spaces of the gas is nearly zero, which results in almost no net thrust. In NMSET with an optimized geometry, however, the weighted sum of expectation values of local momentum spaces of the gas can be non-zero, which leads to a net thrust.

A trivial example of an arrangement that has non-zero net thrust is shown in FIG. 1, as described above. This geometry is not very efficient because macroscopic convective gas flows and vortex formation increase the entropy and limit the amount of useful work. Exemplary convective gas flows 120, 130 are shown in FIG. 2. Gas at ambient temperature 110 flows towards the cold layer 101 and gets cooled. Cooled gas flows 120 away from the cold layer 101 and around the edge of the heat pump 100 towards the hot layer 102. Heated gas flows 130 away from the hot layer 102.

To simplify the description, it may be helpful to think about the system in terms of Newton's second law and the kinetic theory of gases. Around the heat pump 100 in FIGS. 1 and 2, assuming that temperature of the gas is bracketed by the temperatures of the layers 101 and 102, gas particles that collide with the layer 102 leave the layer 102 with greater momentum than before the collision. Similarly, gas particles that collide with the layer 101 leave the layer 101 with lesser momentum than before the collision. Since gas pressure is directly related to momenta of gas particles, gas near the layer 102 has higher pressure than gas near the layer 101. This pressure bias pushes the entire heat pump 100 in the y direction.

In another embodiment, the heat pump 100 can have at least one through hole between the layer 101 and 102. Gas spontaneously flows from the layer 101 to the layer 102 through the hole which enables higher heating rate of the gas. Such preferential flow of gas is referred to as thermal transpiration. Assuming gas near the layer 101 has temperature of $T_c$ and pressure of $P_c$, and gas near the layer 102 has temperature of $T_h$ and pressure of $P_h$, thermal transpiration causes the gas to flow from the layer 101 to the layer 102 through the hole, if the following equation is satisfied:

$$\sqrt{\frac{T_h}{T_c}} \geq \frac{P_h}{P_c} \quad [1]$$

In order to improve efficiency, it is helpful to understand where the classical limit exists within gas flows. Convective descriptions of gas flow break down at around length scales where the Knudsen number appears. As a result, in some aspects, the mean free path of a gas becomes a useful parameter in determining advantageous geometries of NMSET.

Figure 3:
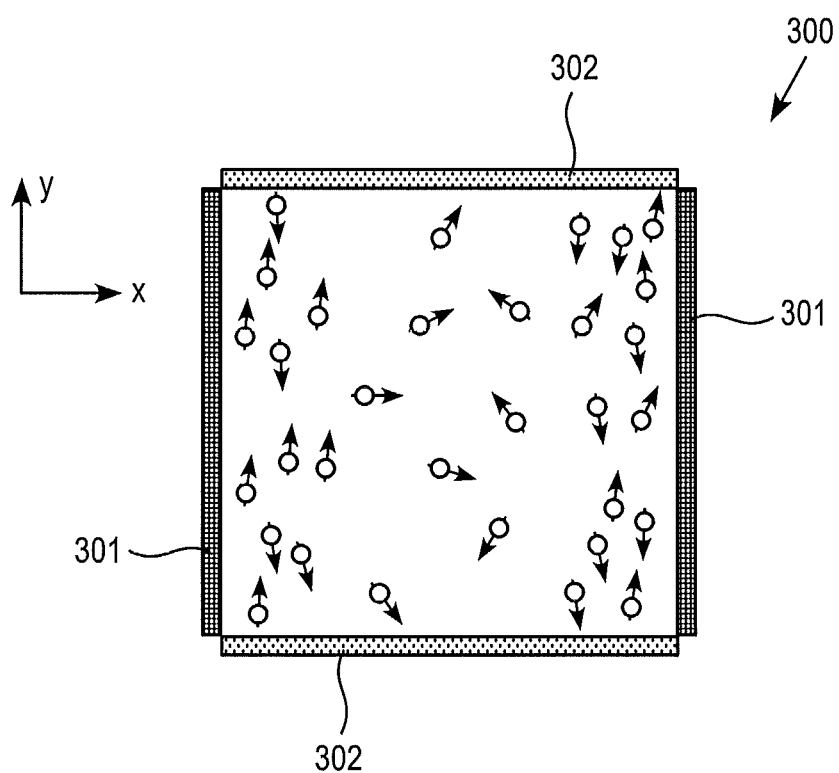
FIG. 3 shows a gas confined in a square box with parallel hot walls and parallel cold walls.

For instance, consider a gas at a particular pressure having a mean free path of 10 nm. If a cloud of such gas is trapped in a two dimensional square 20 nm by 20 nm box as shown in FIG. 3, a gas particle, within 10 nm of travel, will be approximately as likely to have struck another gas particle as it is to have struck the walls of the box. If the walls of the box are heated, then smaller boxes will reach thermodynamic equilibrium with gas therein faster than larger boxes, because gas particles in smaller boxes have more chances to collide with and exchange heat with the walls. Generally, when most of collisions in a gas are between gas particles and a surface, then thermodynamic equilibrium can be achieved approximately in the mean free time (the time it takes a gas particle to travel the mean free path).

Figure 15:
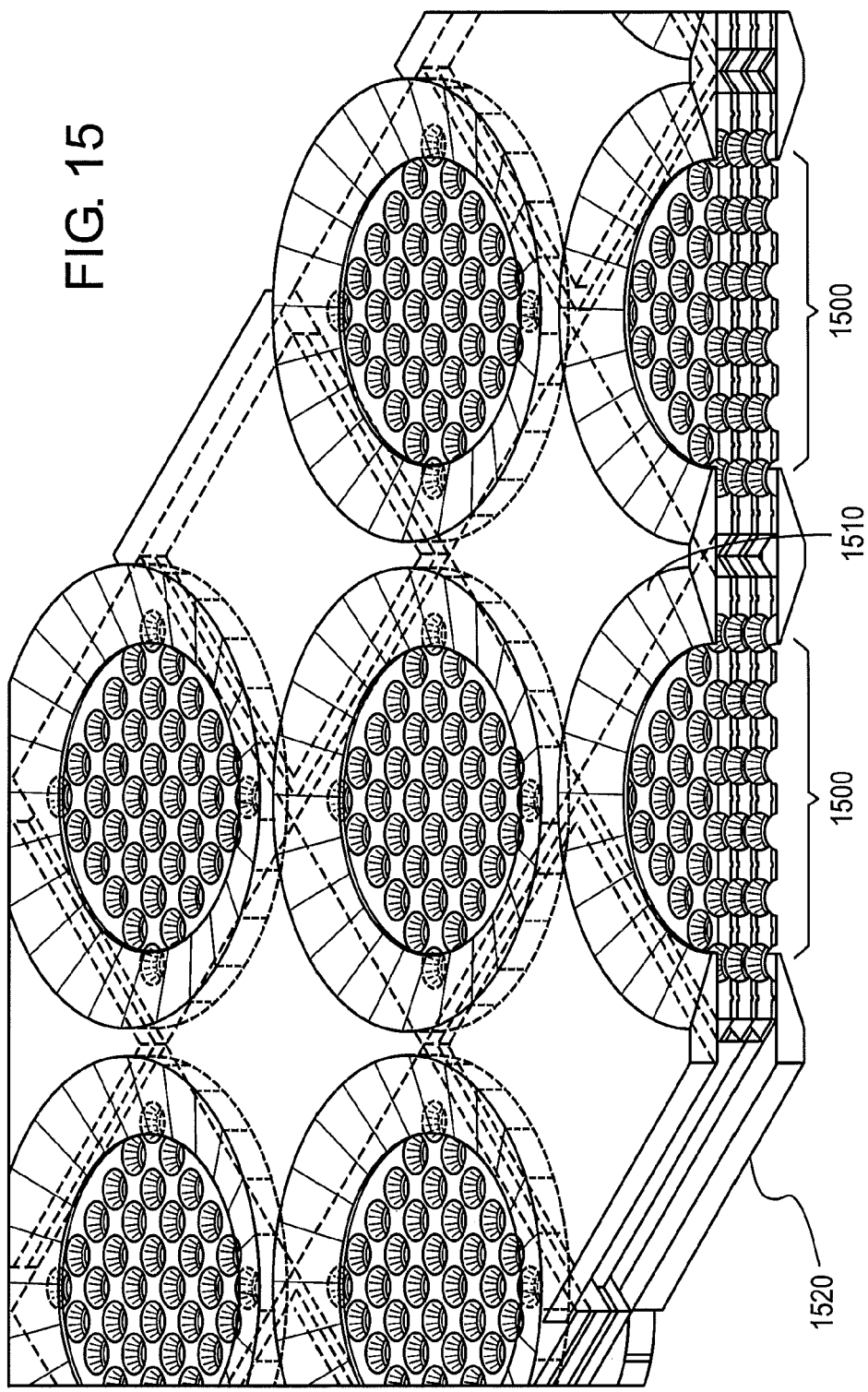
FIG. 15 shows a perspective view of an NMSET with an external solid state heat pump arrangement.
Figure 16:
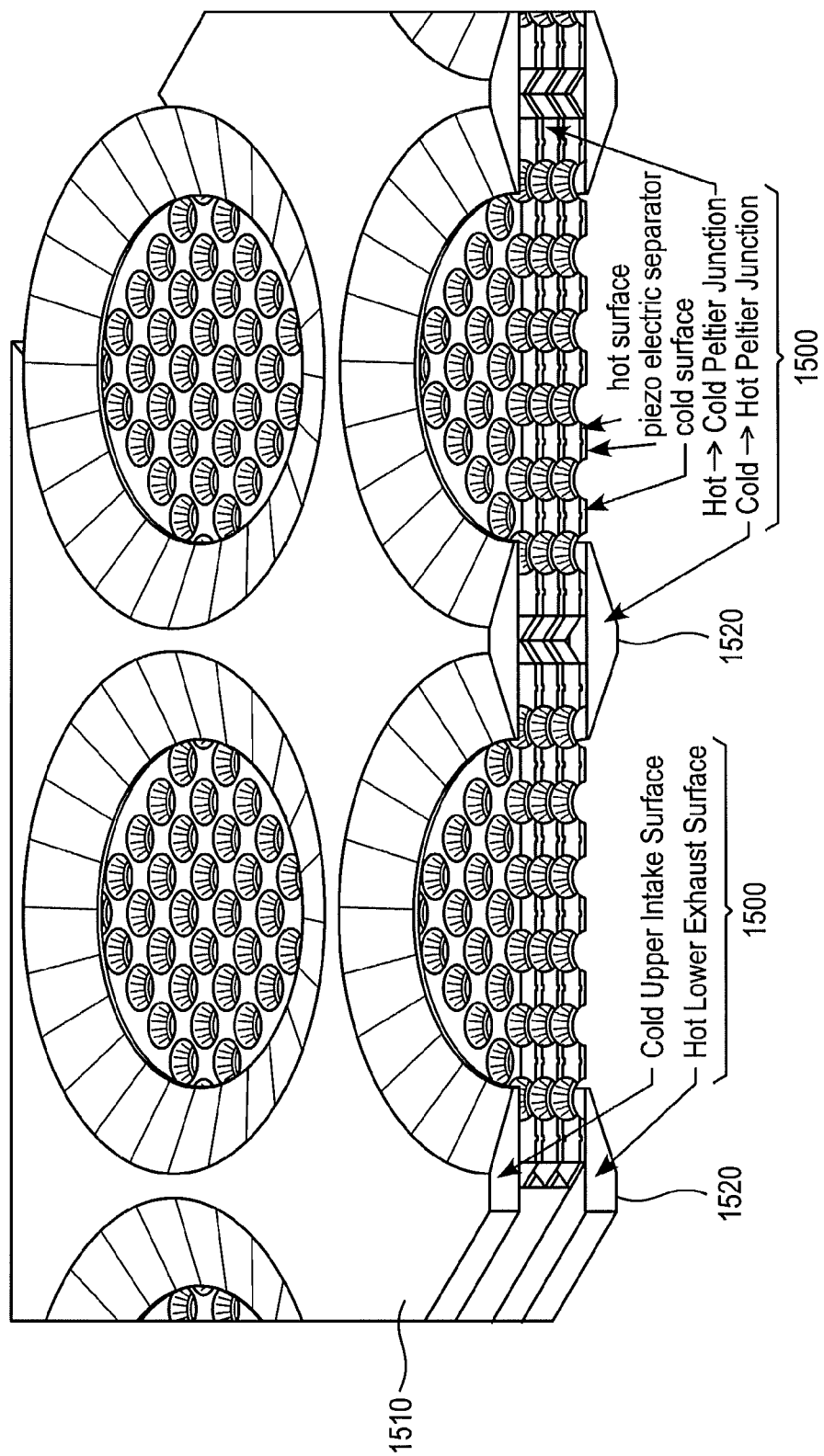
FIG. 16 shows a cross sectional view of NMSET with an external solid state heat pump arrangement of FIG. 15.
Figure 17:
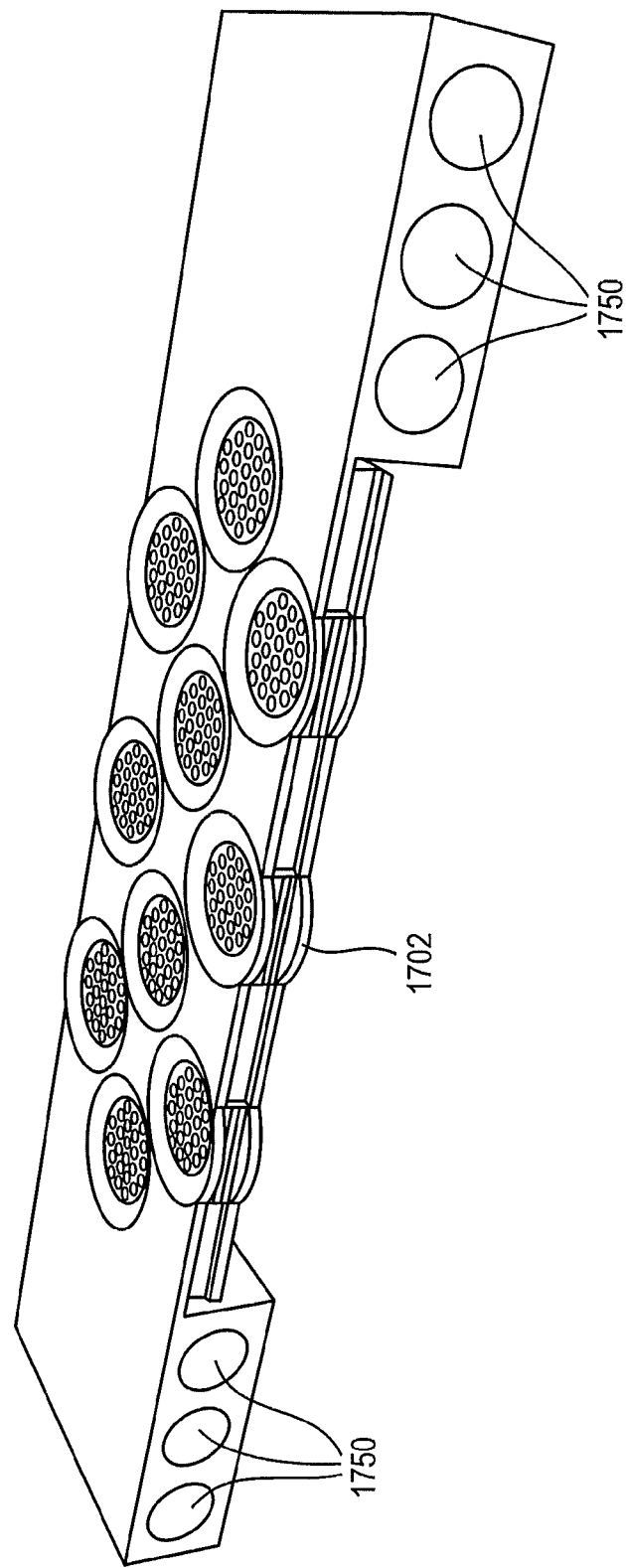
FIG. 17 shows a perspective view of NMSET with an external non-solid state heat pump arrangement.
Figure 18:
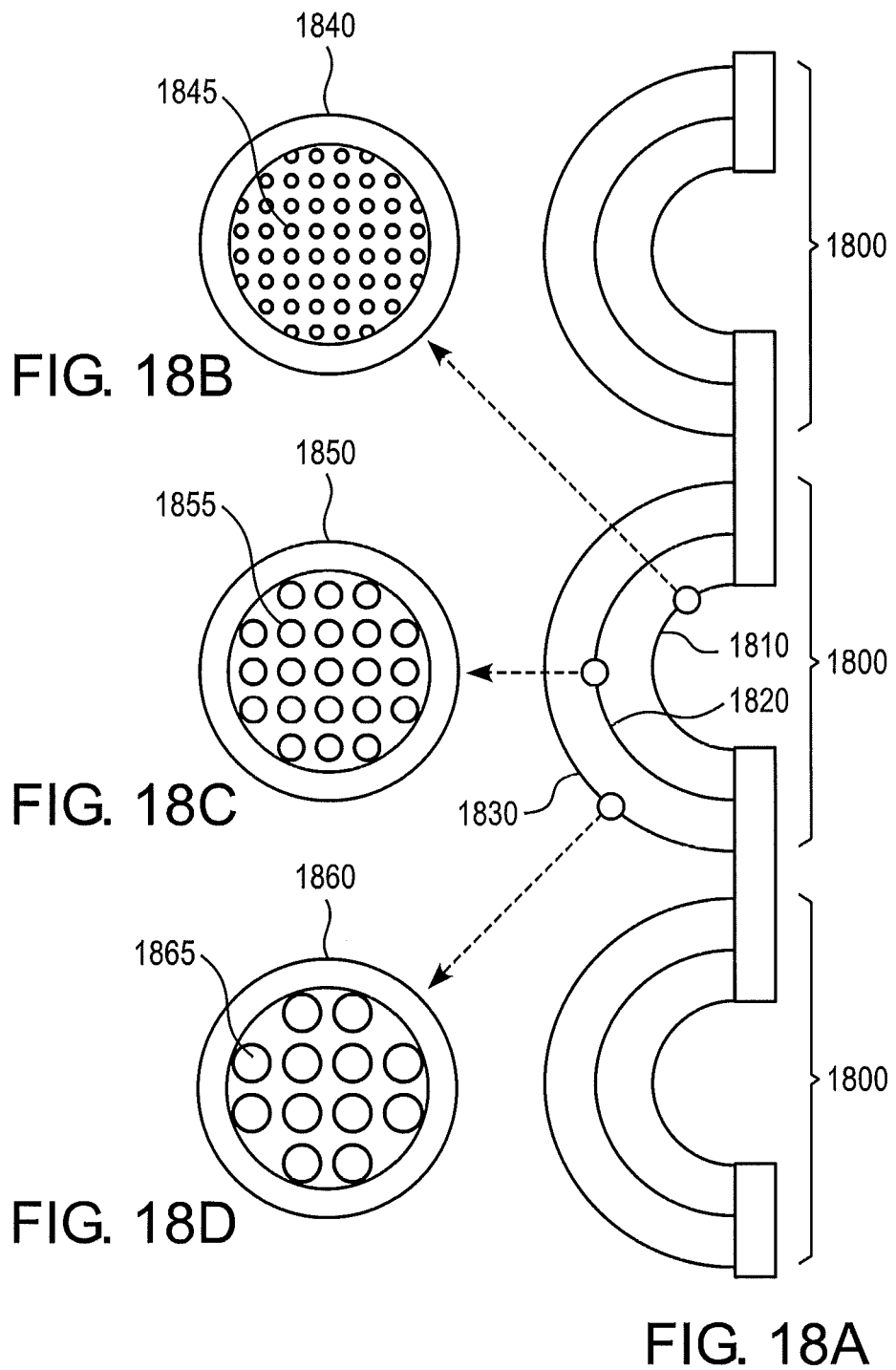
FIG. 18 shows a cross sectional view of a staged NMSET arrangement.

For this reason, in some embodiments, the characteristic scale of individual features of NMSET and related devices may be nanoscale, i.e., the "NM" of NMSET. However, it must be understood that the methods and devices described here are not limited to nanoscale embodiments. The mean free path parameter is dependent on gas density so that in some embodiments and uses, larger scale features may be employed. Furthermore, as described herein, pluralities of NMSET and related device elements can be combined to provide action over a large surface. For example, distributed thrusters such as NMSET may advantageously be arranged in arrays and or arrays of arrays to provide directed movement of gas over across large surfaces, for example, as illustrated in FIGS. 15, 16 and 17. Distributed thrusters such as NMSET can also be arranged in one or more stages to achieve a greater pressure differential, for example as illustrated in FIGS. 18A-18D. FIG. 18A illustrates a cross sectional view of an array of staged distributed thrusters such as NMSET arrangements 1800. Each staged arrangement 1800 is composed of stages 1810, 1820, 1830 of in the form of concentric half-spheres containing arrays of distributed thrusters such as NMSET 1840, 1850, 1860 illustrated in blow-up in FIGS. 18B-18D. Individual distributed thruster apertures 1845, 1855, 1865 in each stage increase in optimal size and thickness in accordance with the decreasing ambient pressure that would be experienced at each previous stage in operation.

Surface Interaction

Interaction between surfaces can affect the momentum space transformation matrix A. If nearby surfaces can easily exchange phonons via gas particles, then the entropy at these surfaces will locally increase at a higher rate than surfaces which cannot easily exchange phonons via development of vortexes. This will generally reduce the efficiency of a system.

One method by which phonon exchange may be reduced is to limit or eliminate any shared bases between surfaces. For instance, consider gas particles in the box 300 in FIG. 3. Box 300 comprises two planar hot walls 302 parallel to each other, and two planar cold walls 301 parallel to each other and perpendicular to the hot walls 302. If the box 300 is comparable in size to the mean free path of the gas particles therein and the walls 301 and 302 are perfectly specular, the gas particles can reach thermal equilibrium with the cold walls 301 and the hot walls 302 independently. This is because surface normals of the walls are only shared between the two cold walls 301 or between the two hot walls 302, but not between a cold wall 301 and a hot wall 302. Consequently, little to no momentum can be exchanged between the hot walls 302 and the cold walls 301 by the gas particles. This is because interaction between the gas particles and the cold walls 301 only affect momenta in the x direction but not momenta in the y direction; and interaction between the gas particles and the hot walls 302 only affect momenta in the y direction but not momenta in the x direction and the fact that momenta in the x direction are orthogonal with momenta in the y direction, assuming no collisions between gas particles. After thermal equilibrium is reached between the gas particles and the walls, the gas particles move faster in the y direction than in the x direction.

As a practical matter, surfaces are usually not perfectly specular. However, specular surface properties exist very strongly in some materials so that there are angles for which convective flows in corners may be reduced. This effect is generally observed when the Knudsen numbers are large, which is a preferred condition for NMSET and related devices, particularly in nanoscale embodiments. The Knudsen number (Kn), named after Danish physicist Martin Knudsen (1871-1949), is a dimensionless number defined as the ratio of the molecular mean free path to a representative physical length scale. In NMSET or the related devices discussed here, the representative physical length scale is taken to be the order of magnitude of the aperture diameter of the device, i.e., the representative physical scale length is, for example, a nanometer if the aperture is measured in nanometers, and a micrometer if the aperture is measured in micrometers. In preferred methods of using the devices disclosed herein the Knudsen number is preferably greater than 0.1, or greater than 1, or greater than 10.

Methods of Optimizing NMSET and Related Devices

Modeling

Performance of NMSET with a specific geometry can be simulated by a Monte-Carlo method for optimization. Specifically, a simulation for NMSET or related device with any given geometry starts with a group of gas particles with random initial positions and momenta around the device. Positions and momenta of these particles after a small time interval are calculated from the initial positions and momenta, using known physical laws, parameters such as temperature, pressure, chemical identity, geometry of the device, interaction between surfaces of the device and the gas particles. The simulation is run through a chosen number of iterations and simulation results are analyzed. The geometry of the device can be optimized using simulation results. In preferred embodiments, a device is constructed using the results of the simulation analysis.

In a preferred embodiment, a simulation can be represented in the following table:

---

Algorithm 1 EVOLVE MODEL(M, P, k)

M←0
P←a set of search parameters
k←number of iterations
for i = 1 to k do
   V←An instance of P
   V←V perturbed by M
   E←MONTE CARLO(V)
   Update M using E
end for

---

A perturbation model M is evolved through a number (k) of iterations. First,

M is initialized to an empty set, indicating no solution knowledge. Then, a loop is started in which the search parameters generate an arbitrary element from the definite search space P and the prior learned knowledge M is used to perturb P. The specific algorithm used to perturb as an implementation detail.

If run in a grid computing environment, M should ideally be identical among all nodes, but this is not necessary due to the inherently stochastic nature of the process. The step of EVOLVE_MODEL which actually runs the Monte-Carlo simulation is the most computationally expensive of all by far and offers a lot of time to synchronize M.

Specific parameters depend on the environment. The parameters that the user can specify include the following:
1. Molecular diagrams, in some embodiments containing up to three atoms, such as $CO_2$ or $H_2O$.
2. Partial concentrations for constituent molecules.
3. Initial temperature and pressure of the entire gas.

In a stationary simulation, the Monte-Carlo simulation can be run with periodic bounds in all axes. In the y axis, however, particles encountering the periodic bound are stochastically thermostatted according to temperature and pressure settings in order to simulate ambient conditions. In the x axis, particle velocities are unmodified in order to simulate a periodic ensemble of identical device assemblies along that direction. The simulation may be run in two dimensions to reduce the computational complexity of the simulation. A three dimensional simulation should give similar results where the modeled device has cylindrical symmetry. Note that in general, a simulator does not have to use the periodicity as indicated here and may not specify any boundaries at all; they are only defined as a computational convenience.

In preferred embodiments, potential device geometries can be evaluated in consideration of the conditions under which a device will be used and known surface reflection properties of the material from which it will be constructed. Geometrical parameters can be optimized by analyzing results from simulation before the geometry is actually used in manufacture of NMSET and related devices.

Example Geometries

Four embodiments with different geometries are particularly discussed below. These four geometries will be referred to as Straight, Parabolic, Triangular, and Sawtooth. It must be noted that the geometries of the NMSET and related devices described here can vary considerably and these examples should be taken only as illustrations for the purpose of discussing the effects of certain design choices on system efficiencies.

Straight

Figure 19:
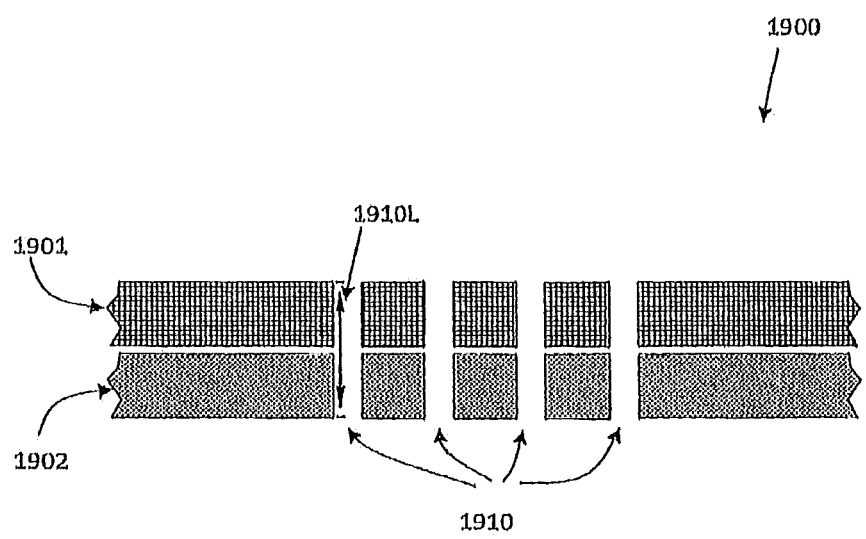
FIG. 19 shows NMSET with a straight geometry.

FIG. 19 shows an embodiment of NMSET or related device 1900 with a straight geometry. In this embodiment, the device 1900 comprises a hot layer 1902 and a cold layer 1901. The terms "hot layer" and "cold layer" mean that these layers have a temperature difference therebetween, not that the "hot layer" is necessarily hotter or the "cold layer" is necessarily colder, than a gas that NMSET or related device is immersed in. At least one straight through hole 1910 extends through all layers of the device 1900 and preferably has a similar cross-sectional shape and size for each set of layers. The straight through hole 1910 can have any cross-sectional shape such as circular, slit, and comb.

Preferably, a total length 1910L (i.e. a distance from one entrance to the other entrance) of the straight through hole 1910 is up to 10 times, up to 5 times or up to 2 times of the mean free path of a gas in which the device 1900 is immersed. The mean free path of air at the standard atmosphere pressure is about 55 nm. At higher altitude, the mean free path of air increases. For atmospheric applications, the total length 1910L is preferably not greater than 1500 nm, and depending on application more preferably not greater than 550 nm, not greater than 275 nm or not greater than 110 nm. A temperature differential between the hot layer 1902 and the cold layer 1901 is preferably at least 0.5° C., more preferably at least 30° C., more preferably at least 50° C., and most preferably at least 100° C.

The hot layer 1902 and the cold layer 1901 may be separated by a gap therebetween for thermal isolation. The gap preferably is a vacuum gap and/or contains a thermal insulator. In one example, the gap contains a plurality of thin pillars made of a good thermal insulator such as silicon dioxide.

The device 1900 has preferably at least 10 straight through holes per square centimeter. A total perimeter length of all the straight through holes of the device 1900 per square centimeter is preferably at least two centimeters.

Parabolic

Figure 7:
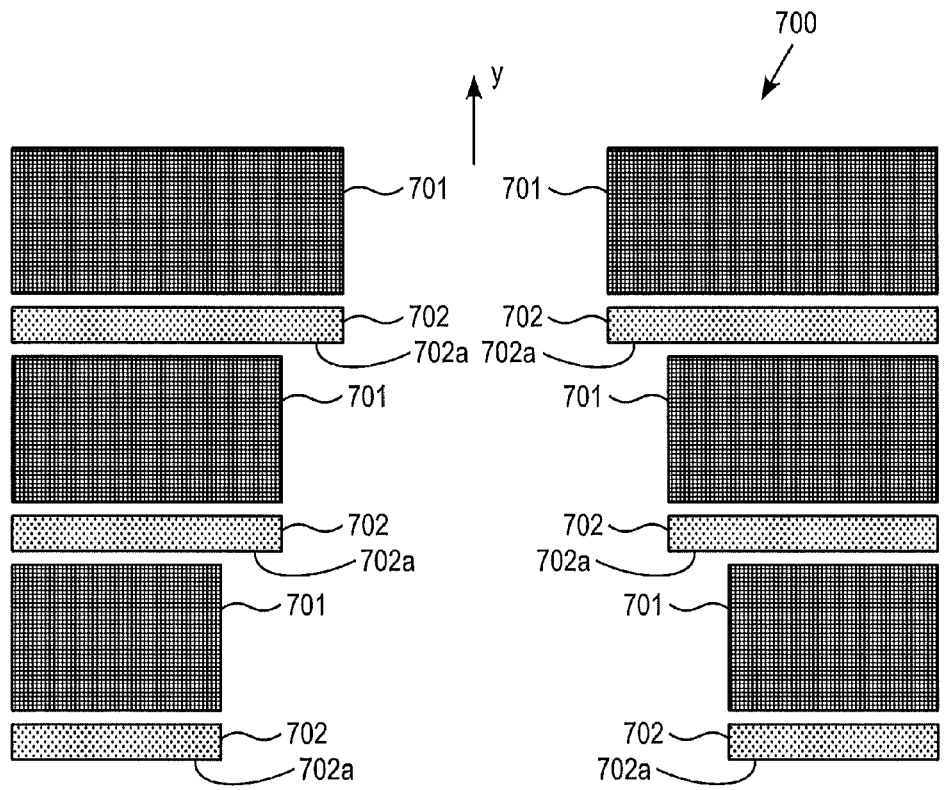
FIG. 7 shows a stack of NMSET with a parabolic geometry.
Figure 8:
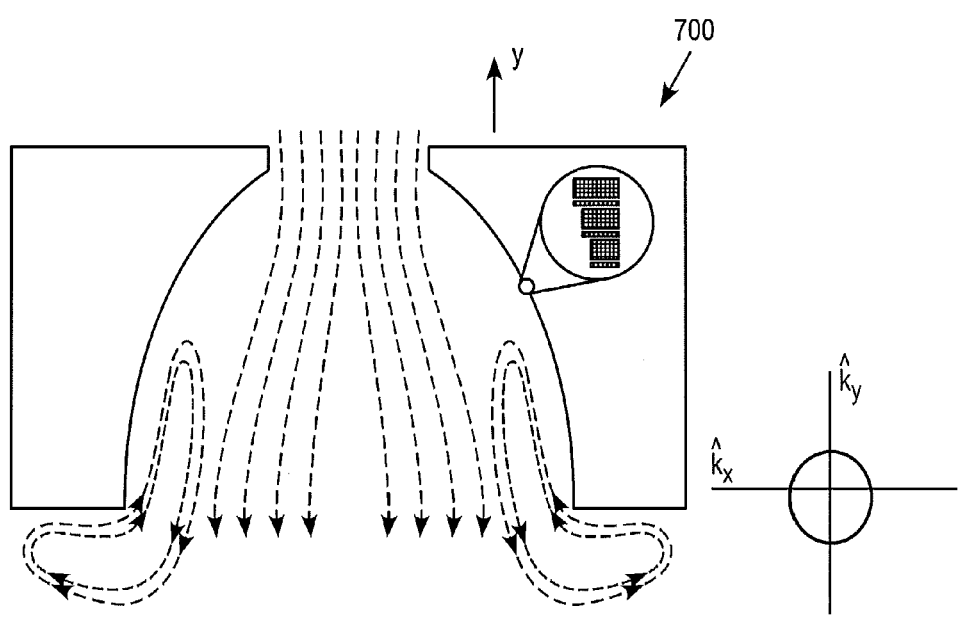
FIG. 8 shows gas flow patterns around the stack of NMSET of FIG. 7 and the momentum space of the gas.

FIG. 7 shows an embodiment of an NMSET or related device 700 with a parabolic geometry. In this embodiment, alternating hot layers 702 and cold layers 701 are stacked. In the illustration, each hot layer 702 and cold layer 701 has a straight through hole. All the holes are aligned. The hole in each hot layer 702 has the similar size as the hole in the cold layer 701 immediately above, and is smaller than the hole in the cold layer 701 immediately below. Each cold layer 701 is colder than its immediate adjacent hot layers 702 and each hot layer 702 is hotter than its immediate adjacent cold layers 701. A surface 702a of each hot layer 702, which has a surface normal in the −y direction, is exposed. All the holes collectively form a nozzle with a contour of a parabolic surface. This geometry minimizes shared bases between the hot and cold layers. However, because NMSET or related device may not substantially increase the energy of the gas, the increasing hole diameter may result in a drop in gas pressure at the edges. This can create strong vortexes near the lower aperture, which reduce total efficiency. NMSET with the parabolic geometry can be adiabatic or isobaric, but not both. An approximation of gas flow in NMSET or related device with the parabolic geometry is shown in FIG. 8. The momentum space of the gas is skewed such that the expectation value of the momentum points to the −y direction.

Although the parabolic geometry is effective in NMSET or related device, a drop in gas pressure puts an upper bound on the size of the lower aperture. In general, any adiabatic device in which the gas being moved undergoes a change in volume will suffer in its efficiency.

If the temperature differential in a device with the parabolic geometry is established by a diabatic means (i.e. the device raises the overall temperature of the gas), then the NMSET with the parabolic geometry may not suffer in its efficiency from the gas undergoing a change in volume, as long as the amount of heat added to the gas is sufficient to prevent the formation of vortexes. However, such a device suffers in its efficiency from higher total entropy, i.e., the eigenvectors of the momentum space of the gas are not as far apart if the gas has to expand, but supplying heat at small scales is typically easier than carrying it away.

Triangular

Figure 9:
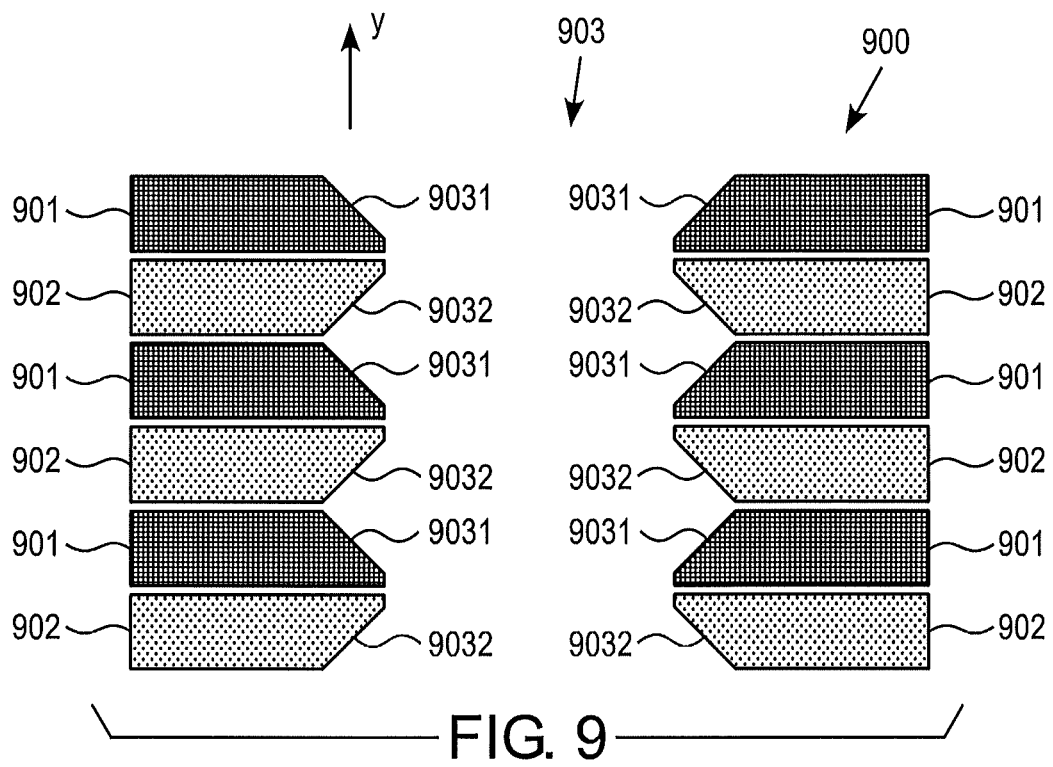
FIG. 9 shows a stack of NMSET with a triangular geometry.

The triangular geometry detailed in FIG. 9 is a partial optimization of the parabolic geometry for adiabatic flows. In this case, the gas is not permitted to experience a sufficient expansion to trigger large-scale vortex generation. Furthermore, because the apertures do not change size, a triangular arrangement such as this one may be easily stacked.

Figure 10:
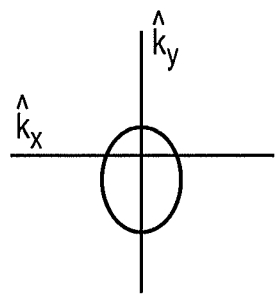
FIG. 10 shows the momentum space of the gas around the stack of NMSET with a triangular geometry.

The momentum space of this triangular geometry is more efficiently biased, as is illustrated in FIG. 10. As in the parabolic arrangement, the exposed hot and cold surfaces meet at preferably a 90-degree angle; however, a source of inefficiency arises when particles carry heat back and forth between surfaces across the center gap.

FIG. 9 shows a stack 900 of NMSET or related device with the triangular geometry. Each device in the stack 900 comprises a hot layer 902 and a cold layer 901 of equal thickness. The temperature differential between the cold and hot layers 901 and 902 can be established by any suitable means such as the Peltier effect or any other heat pump. Each device has a through hole 903. Each though hole 903 has approximately a 45° chamfer (9031 and 9032) on each entrance. The surface of the chamfers 9031 and 9032 is, for example, from 1.40 to 1.42 times of the thickness of the cold and hot layers 901 and 902, not including modifications to the acute angles for structural considerations. The through holes 903 in all layers in the stack 900 are aligned. In general, the temperatures of the hot layers 902 in a device in the stack 900 do not increase monotonically from one side of the stack to the other side. In general, the temperatures of the cold layers 901 in a device in the stack 900 do not decrease monotonically from one side of the stack to the other side. Preferably, each cold layer 901 is colder than its immediate adjacent hot layers 902 and each hot layer 902 is hotter than its immediate adjacent cold layers 901. For engineering reasons, the hot and cold surfaces of the triangular arrangement may not come to a fine point.

Sawtooth

Figure 11:
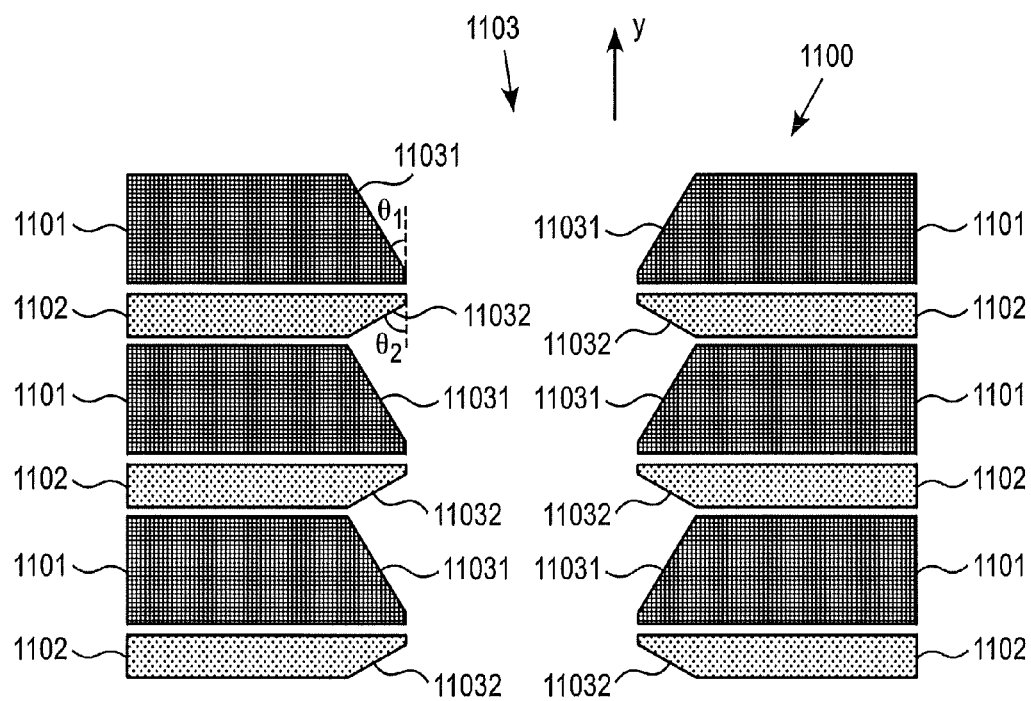
FIG. 11 shows a stack of NMSET with a sawtooth geometry.

FIG. 11 shows a stack 1100 of NMSET or related device with a sawtooth geometry. Each device in the stack 1100 comprises a hot layer 1102 with a thickness of $t_h$ and a cold layer 1101 with a thickness $t_c$. The temperature differential between the cold and hot layers 1101 and 1102 can be established by any suitable means such as the Peltier effect or any other heat pump. Each device has a through hole 1103. In the illustrated device, each through hole 1103 has a chamfer 11031 at the entrance on the side of the cold layer 1101, and a chamfer 11032 at the entrance on the side of the hot layer 1102. An angle between the chamfer 11031 and a center axis of the through hole 1103 is $\theta_1$; an angle between the chamfer 11032 and a center axis of the through hole 1103 is $\theta_2$. The sum of $\theta_1$ and $\theta_2$ is preferably from 75° to 105°, more preferably from 85° to 95, and more preferably from 88° to 92°. The ratio of $t_c$ to $t_h$ is substantially equal to the ratio of cotangent of $\theta_1$ to cotangent of $\theta_2$. $\theta_2$ is preferably from 70° to 85°.

The relationships of the chamfer angles described here are preferred limitations, not hard boundaries. In general for materials exhibit perfectly specular molecular reflection properties, the relationships of the chamfer angles can be slightly relaxed. For materials exhibit less than perfectly specular molecular reflection properties, the relationships shall be stringent. The chamfer geometries are preferably arranged so as to minimize shared bases. The surface normals of the specularly reflecting chamfer surfaces can thus preferably be orthogonal. Deviations from orthogonality can incur a penalty in efficiency as a cosine function. For engineering reasons, the hot and cold surfaces of the sawtooth arrangement may not come to a fine point.

In the illustrated device, the through holes 1103 in all layers in the stack 1100 are aligned. Temperatures of the hot layers 1102 in each device in the stack 1100 do not increase monotonically from one side of the stack to the other side. Temperatures of the cold layers 1101 in each device in the stack 1100 do not decrease monotonically from one side of the stack 1100 to the other side. Each cold layer 1101 is colder than its immediate adjacent hot layers 1102 and each hot layer 1102 is hotter than its immediate adjacent cold layers 1101.

The sawtooth geometry shown in FIG. 11 offers an improvement over the triangular geometry in that all hot layers 1102 are preferably oriented in nearly the same direction (i.e., $\theta_2$ is preferably nearly 90°). This reduces direct interaction between hot and cold layers 1102 and 1101 across the through hole 1103, and improves overall efficiency.

Figure 12:
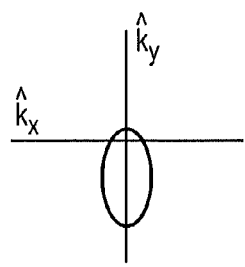
FIG. 12 shows the momentum space of the gas around the stack of NMSET with a sawtooth geometry.

Furthermore, because the hot layers 1102 have a lower exposed surface area than the cold layers 1101, and because the cold layers 1101 are preferably oriented at a shallower angle relative to the center axis of the through hole 1103 than in the triangular geometry, the sawtooth geometry is capable of reducing the entropy in the gas (and thereby causing it to do more work) more efficiently than the triangular geometry. The momentum space of this sawtooth geometry is more efficiently biased than the momentum space of the triangular geometry, as is illustrated in FIG. 12.

In the triangular configuration, device slices on opposite sides of a cross section have a magnitude of $1/\sqrt{2}$ in the y axis because their separation angle 90 degrees. This limits the efficiency of entropy reduction, as some of the entropy is going to be neutralized in direct inter-surface interaction.

In the sawtooth configuration, however, the hot layers 1102 not only share no basis with the adjacent cold layers 1101, but also share very little basis with hot and cold layers across the through hole 1103. This combined property makes the sawtooth geometry more efficient than the triangular geometry.

Figure 4:
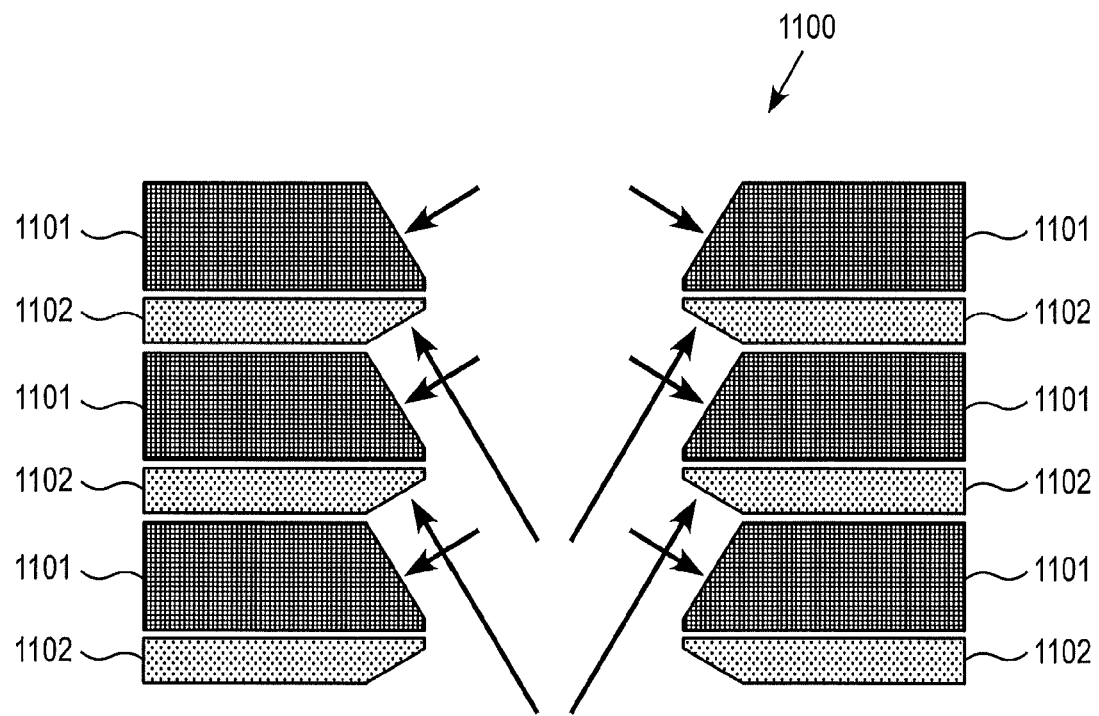
FIG. 4 shows net forces on a stack of Nano Molecular Solid-state Electrodynamic Thrusters ("NMSET") with sawtooth geometry.
Figure 5:
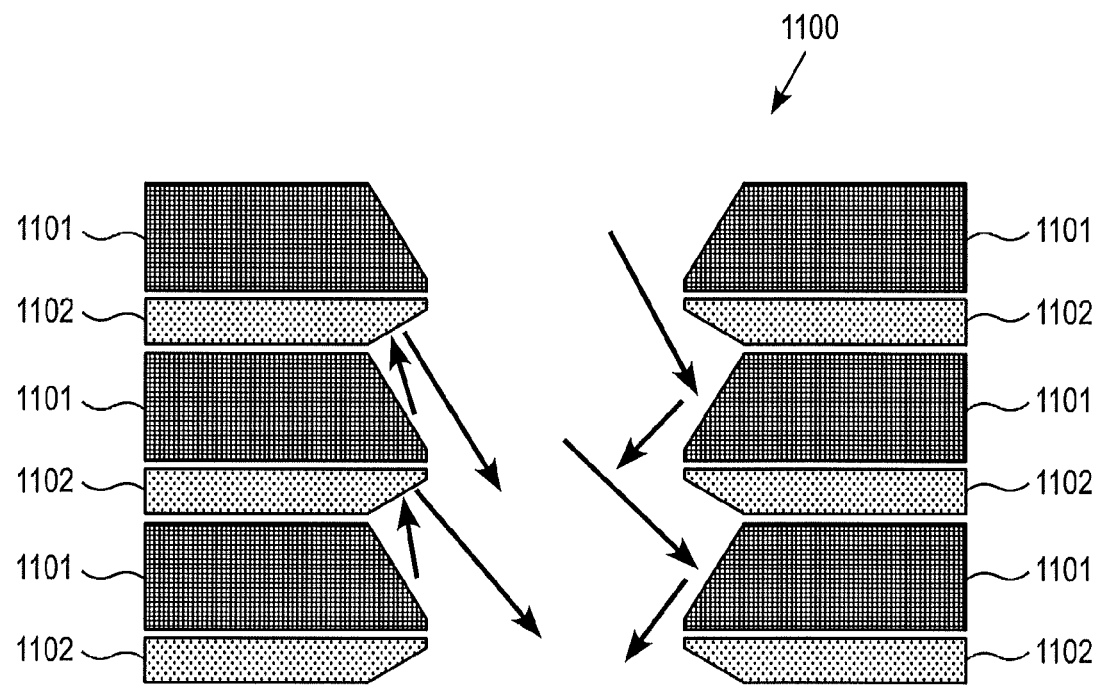
FIG. 5 shows gas particle velocities around a stack of NMSET with sawtooth geometry.

After NMSET or related device is powered (i.e. temperature differential is established), gas particles rebounding from cold layers have a reduced net velocity, while gas particles rebounding from hot layers have higher net velocity. FIG. 4 shows net forces the layers of the stack 1100 (sawtooth geometry) experience. In a stable state, low pressure is generated at the entrance aperture (upper aperture in FIG. 4) which in turn generates a corresponding low-pressure region above the stack 1100, and a high-pressure region below the stack 1100. Gas particle velocities of the stack 1100 resulting from the gas particle collisions are shown in FIG. 5.

Means for Establishing Temperature Differential

Internal Peltier

According to one embodiment, each element in the device geometry acts both as a particle director and as the entropy reducer. In a Peltier device, the hot and cold plates are made of materials with different Peltier coefficients. Electrical current is made to flow between the cold and hot plates. This flow of current carries with it Peltier heat, establishing the temperature differential necessary to operate the device. In some embodiments, piezoelectric spacers can be disposed between device elements to maintain the separation gaps therebetween.

Figure 13:
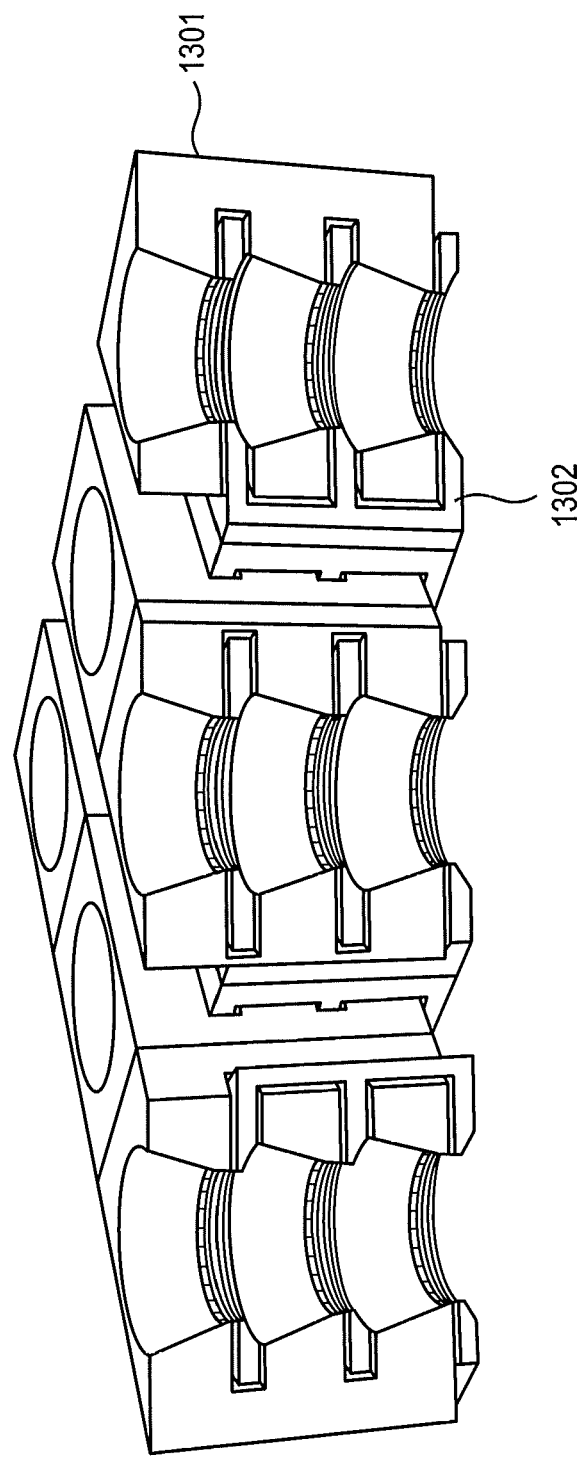
FIG. 13 shows a cross sectional view of an NMSET with an internal arrangement of solid state heat pumps. These heat pumps can be driven by Peltier effect, thermionic emission, or any other suitable means.
Figure 14:
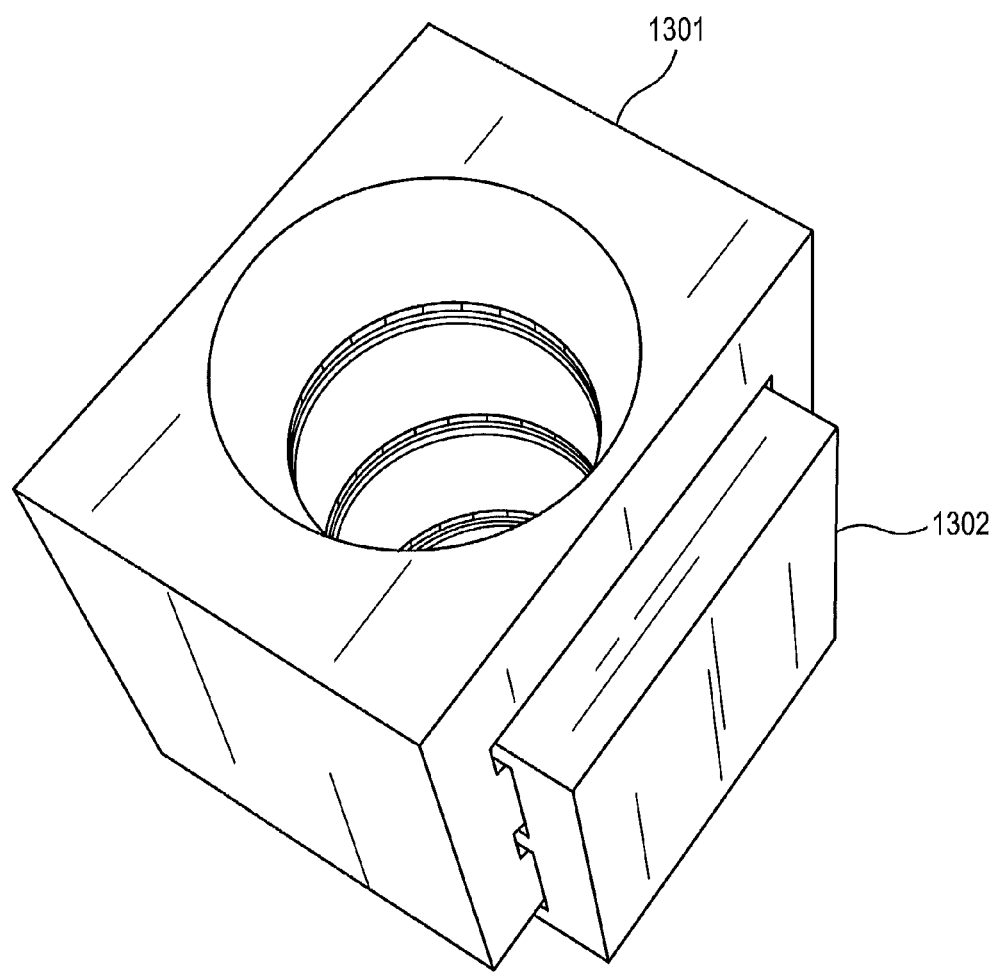
FIG. 14 shows a perspective view of NMSET with an internal solid state heat pump arrangement on FIG. 13.

A cross section of NMSET or related device according to an embodiment with an internal Peltier arrangement is detailed in FIGS. 13 and 14. All hot layers 1302 are connected. All cold layers 1301 are connected. Electric current flows through a Peltier device interposed between the cold and hot layers to establish a temperature differential. The thinner the layers are, the higher the electric current is necessary.

NMSET or related device with the internal Peltier arrangement can make it easier to reduce the size of the device. A single stack such as the one shown in FIG. 14 can be fully functional to generate thrust. NMSET or related device with the internal heat pump are further suitable for use in microelectromechanical systems (MEMs) that emphasize the highest degree of granularity.

Field-Enhanced Thermionic Emission

In another embodiment, the temperature differential can be generated by field-enhanced thermionic emission. As shown in FIG. 19, an electrical field can be established between the layers 1901 and 1902 such that charge carriers thermally emitted from the cold layer 1901 carry heat from the cold layer 1901 to the hot layer 1902.

External Peltier

In another embodiment, the temperature differential can be generated by a heat pump, such as a Peltier device external to NMSET or related device. This Peltier device arranged in a checker board fashion is thermally coupled to NMSET or related device stack 1500 via interface layers 1510 and 1520 as detailed in FIGS. 15 and 16.

A device with an external Peltier device has the benefit of separating the materials used to generate gas flow from the materials used to generate the temperature differential. From an engineering standpoint this may be desirable, as the materials suitable for a heat pump may not be suitable for microstructures, or vice versa. In addition, an external heat pump can be made larger and more efficient, and may require less current to establish a sufficient temperature differential.

Piezoelectric spacers can be used between layers. Materials suitable for use in NMSET preferably are strong enough to mechanically withstand thermal expansion and contraction, and/or preferably have very small expansion coefficients. Otherwise, holes in the layers could become misaligned, which could reduce efficiency.

External Non-Peltier

According to yet another embodiment, a temperature differential is established by any suitable heat source and/or heat sinks. For example, the heat sources might be field-enhanced thermionic emission, resistive heaters, chemical reaction, combustion, and/or direct illumination of bright light or other forms of radiation. An illustration of such an embodiment is shown in FIG. 17. In the example shown, a heating surface 1702 can be resistive heating material, or a material that can efficiently receive radiative heating. The external non-Peltier heat pump is convenient because it does not require a built in heat pump such as a Peltier device. For some applications, it may be convenient to direct the heating surface towards a source of radiation, such as the sun, rather than first converting radiation into electricity and drive a heat pump. Alternatively, a source of radiation may be directed toward a heat absorbing surface in thermal communication with the hot layer of NMSET or related device. In an external non-Peltier heat pump, however, more care is preferably taken to ensure that the NMSET or related device does not overheat.

The capillaries 1750 illustrated in FIG. 17 provide an exemplary mechanism by which a heat sink could be provided; however, it is also possible for the heat sink to simply be a series of vanes, or any other suitable heat sinks. Alternatively, the external non-Peltier heat pump in FIG. 17 could be configured to provide a heat source through the capillaries 1750. The heat source can be an exothermic chemical reaction, preferably one that does not generate too much pressure.

Materials

NMSET and related devices may be constructed of a wide range of materials. In various aspects, properties of materials may be exploited in combination with desirable geometries.

Specular reflection of gas molecules is a preferred property of the materials which form the gas-exposed surfaces of NMSET or related device, e.g. the heated and cooled surfaces which are in contact with flowing gas. Specular reflection is the mirror-like reflection of light, or in this case gas particles, from a surface. On a specular surface, incoming gas particles at a single incident angle are reflected from the surface into a single outgoing angle. If the incoming gas particles and the surface have the same temperature, the incident angle and the outgoing angle with respect to the surface normal are the same. That is, the angle of incidence equals the angle of reflection. A second defining characteristic of specular reflection is that incident, normal, and reflected directions are coplanar. If the incoming gas particles and the surface are not at the same temperature and the reflection is diabatic (i.e. with heat exchange between the gas particles and the surface), the angle of reflection is a function of heat transferred between the surface and the gas particles.

The degree of specularity of a material may be represented by a reflection kernel (such as the Cercignani-Lampis kernel) which is defined as the probability density function of reflected state of the gas particles per unit volume of the phase space. Details of the reflection kernel are disclosed in "Numerical Analysis of Gas-Surface Scattering Effect on Thermal Transpiration in the Free Molecular Regime", *Vacuum*, Vol. 82, Page 20-29, 2009, and references cited therein, all of which are hereby incorporated by reference.

Individual hot and cold layers may also be constructed of one or more structural elements which can comprise structural materials, e.g. a means for conferring rigidity, thermal conductive material, e.g. a means for heat transfer to and from a temperature differential generating means, and atomic reflection material, e.g. means for providing a desirable reflection kernel properties. In some embodiment, individual hot and cold layers may be constructed of layered composites of such materials.

Thus, the choice of materials is and composition is widely variable. In some embodiments, materials suitable for construction of NMSET or related device can include titanium, silicon, steel, and/or iron. Titanium is light weight and possesses a hexagonal crystalline structure. Interfaces of titanium may be created at orthogonal angles without crystalline warping and therefore no stress limit. Material costs of titanium are high. Silicon is inexpensive and has well understood properties and processes for machining. The crystalline structure of silicon is diamond cubic. Steel is cheaper than titanium, possesses a cubic crystalline structure, and is highly resistant to gaseous intrusion. Iron is cheaper than steel and has a crystalline form which makes it suitable for application in NMSET and related devices.

Exemplary Methods of Manufacturing NMSET or Related Device

According to one embodiment as shown in FIG. 20, a method of manufacturing an NMSET or related device comprises: (a) providing a suitable substrate 2001 such as, for example, amorphous silicon, crystalline silicon, ceramic, etc., the substrate preferably having a thickness of 500 to 1500 microns; however thinner and thicker substrates are possible; (b) depositing a first layer 2002, a mostly sacrificial layer, preferably an electrical insulator, such as, for example, silicon dioxide, the first layer 2002 preferably having a thickness of 200 nm to 50 microns, however thinner and thicker layers are possible. Furthermore, depending on the area of the substrate window 2001a, it is advantageous for this layer to have a tunable stress level. For example, for a 1 cm$^2$ substrate window 2001a, successful results have been achieved with SiO$_x$N$_y$ at 60 MPa tensile strength; (c) forming a pattern of discrete islands in any suitable shape such as, for example, strip, square, circle from the first layer 2002 by photolithography and etching the first layer 2002; (d) depositing a second layer 2003 over the discrete islands, the second layer 2003 being an electrical conductor such as, for example, Al, Nb or Zn, preferably having a thickness of 5 to 200 nm, however, other thicknesses are contemplated; (e) depositing a third layer 2004 over the second layer 2003, the third layer 2004 being an electrical insulator such as, for example, silicon dioxide or the same material used in layer 2002, preferably having the same thickness as the first layer 2002, however, other thicknesses are contemplated; (f) partially removing the third layer 2004 and the second layer 2003 until the first layer 2002 is exposed; (g) depositing a fourth layer 2005, the fourth layer 2005 being an electrical insulator such as, for example, silicon dioxide preferably of the same material as 2003, the fourth layer 2005 preferably having a thickness of 3 to 15 nm, thinner is better as long as there are few or no gaps in coverage; (h) depositing a fifth layer 2006, the fifth layer being an electrical conductor such as, for example, Pt, Ni or Cu, and preferably having a thickness of 5 to 200 nm, however, other thicknesses are contemplated; (i) depositing a sixth layer 2007, such layer being formed to protect the front side of the substrate while the backside is being worked on. Such layer can be made of, for example, wax, photoresist, or silicon dioxide substrate attached to the fifth layer 2006 via thermal release tape, the sixth layer 2007 preferably having a thickness of 500 to 1500 microns, however, other thicknesses are contemplated; (j) forming through holes 2001a in the substrate 2001 by photolithography and etching the substrate 2001, such that at least one discrete island of the first layer 2002 is exposed therein, the through holes 2001a having any suitable shape such as, for example, hexagons, squares and circles, the through holes 2001 being arranged in any suitable pattern such as, for example, a hexagonal grid, square grid and a polar grid; (k) removing exposed discrete islands by etching until portions of the fourth layer 2005 there above are exposed; (l) removing exposed portions of the fourth layer 2005 by etching until portions of the fifth layer 2006 there above are exposed; (m) removing exposed portions of the fifth layer 2006 by etching; (n) partially removing the fourth layer 2005 by etching laterally such that the second layer 2003 and the fifth layer 2006 overhang the fourth layer 2005 by 2-10 nm; (o) completely removing the sixth layer 2007 by thermal release, dissolving or etching. The second layer 2003 and the fifth layer 2006 preferably have a difference of at least 0.1 eV, at least 1 eV, at least 2 eV or at least 3 eV in their work-functions.

According to another embodiment as shown in FIG. 21, a method of manufacturing an NMSET or related device comprises: (a) providing a suitable substrate 2101 such as, for example, amorphous silicon, crystalline silicon, ceramic, etc., the substrate preferably having a thickness of 500 to 1500 microns; however thinner and thicker substrates are possible; (b) depositing a first layer 2102, a mostly sacrificial layer, preferably an electrical insulator such as, for example, silicon dioxide, the first layer 2102 preferably having a thickness of 50 nm to 1000 nm; however thinner and thicker layers are possible. Furthermore, depending on the area of the substrate window 2101a, it is advantageous for this layer to have a tunable stress level. For example, for a 1 cm$^2$ substrate window 2101a, successful results have been achieved with SiO$_x$N$_y$ at 60 MPa tensile strength; (c) depositing a second layer 2103 over the first layer 2102, the second layer 2103 being an electrical conductor such as, for example, Al, Nb or Zn and preferably having a thickness of 5 to 150 nm, however, other thicknesses are contemplated; (d) depositing a third layer 2104 over the second layer 2103, the third layer 2104 being an electrical insulator such as, for example, silicon dioxide and preferably having a thickness of 5 to 100 nm, however, other thicknesses are contemplated, and preferably the same material as 2102; (e) depositing a fourth layer 2105 over the third layer 2104, the fourth layer 2105 being an electrical conductor such as, for example, Pt, Ni or Cu and preferably having a thickness of 5-150 nm, however, other thicknesses are contemplated; (f) forming holes through the second layer 2103, the third layer 2104 and the fourth layer 2105 by photolithography and etching, the holes having any suitable shape such as, for example, strips, squares, circles; (g) partially removing the third layer 2104 by etching laterally such that the second layer 2103 and the fourth layer 2105 overhang the third layer 2104; (h) forming through holes 2101a in the substrate 2101 by photolithography and etching the substrate 2101, such that at least one hole through the second layer 2103, the third layer 2104 and the fourth layer 2105 overlaps with one through hole 2101a, the through holes 2101a having any suitable shape such as, for example, hexagons, squares and circles, the through holes 2101 being arranged in any suitable pattern such as, for example, a hexagonal grid, square grid and a polar grid; (i) removing portions of the first layer 2102 exposed in the through holes 2101a. The second layer 2103 and the fourth layer 2105 preferably have a difference of at least 0.1 eV, at least 1 eV, at least 2 eV or at least 3 eV in their work-functions.

While NMSET and related device have been described in detail with reference to specific embodiments thereof, it will be apparent to those skilled in the art that various changes and modifications can be made, and equivalents employed, without departing from the scope of the appended claims.

We claim:

1. An apparatus operable to propel a gas, comprising:
at least a first layer and a second layer arranged in a stack and means for heating and/or cooling the first and second layers to form a hot layer and a cold layer wherein the cold layer has a lower temperature than the hot layer; and,
at least one through hole in the stack;
wherein:
a surface of each hot layer is exposed in an interior of the through hole; and
a surface of each cold layer is exposed in the interior of the through hole;
and wherein an entire length of the through hole is up to 10 times of a mean free path of a gas in which the apparatus is immersed and/or is not greater than 1500 nm, and
wherein each hot layer has a chamfer facing inward and in a first direction, an angle between the chamfer of each hot layer and a center axis of the through hole being $\theta_2$;
each cold layer has a chamfer facing inward and in a second direction opposed to the first direction, an angle between the chamfer of each cold layer and the center axis of the through hole being $\theta_1$.

2. The apparatus of claim 1, wherein means for heating and cooling the first and second layers is a Peltier device or a field-enhanced thermionic emission device.

3. The apparatus of claim 2, wherein the Peltier device or the field-enhanced thermionic emission device is interposed between the first and second layers.

4. The apparatus of claim 1, wherein the hot layer is heated by one or more resistive heaters, a chemical reaction, and/or radiation.

5. The apparatus of claim 1, wherein the through hole has progressively larger cross section areas from an upper face to a lower face of the stack; the exposed surface of each cold layer in the interior of the through hole is substantially parallel to a center axis of the through hole; the exposed surface of each hot layer in the interior of the through hole is substantially perpendicular to the center axis of the through hole.

6. The apparatus of claim 1, wherein a sum of $\theta_1$ and $\theta_2$ is from 85° to 95°.

7. The apparatus of claim 6, wherein $\theta_2$ is from 70 to 85°.

8. The apparatus of claim 6, wherein each hot layer has a thickness of $t_h$, each cold layer has a thickness of $t_c$, and the ratio of $t_h$ to $t_c$ is substantially equal to the ratio of cotangent of $\theta_2$ to cotangent of $\theta_1$.

9. The apparatus of claim 8, wherein $t_c$ is greater than $t_h$.

10. The apparatus of claim 1, wherein a gap is interposed between the hot and cold layers.

11. The apparatus of claim 10, wherein the gap comprises spacer elements.

12. The apparatus of claim 11, wherein the spacer elements comprise piezoelectric material.

13. A method of using the apparatus of claim 1 comprising exposing the apparatus to a gas at an ambient temperature and pressure and activating the means of heating and/or cooling alternating layers to form alternating hot and cold layers such that the gas is propelled through the through hole.

14. The method of claim 13 wherein each hot layer is hotter than the ambient temperature of the gas and each cold layer is colder than the ambient temperature of the gas.

15. The method of claim 13 wherein a mean temperature of all the hot and cold layers is substantially the same as the ambient temperature of the gas.

16. A method of manufacturing the apparatus of claim 1, comprising:
running a simulation of an apparatus according to claim 1 having a specific selected starting geometric arrangement of through hole and layers, the simulation comprising initializing a group of simulated gas particles with random initial positions and momenta around a simulated apparatus, calculating positions and momenta of these particles after a small time interval from the initial positions and momenta using known physical laws, repeating the calculation through a chosen number of iterations, and analyzing the positions and momenta of the gas particles through the simulation,
modifying the geometric arrangement of the device within a defined search space and running another simulation through a chosen number of iterations,
identifying a geometric arrangement providing more efficient propulsion of gas particles through a simulated apparatus than the starting geometry;
manufacturing an apparatus having the identified geometric arrangement.

17. An apparatus to propel a gas, comprising:
a series of stacks, wherein each stack includes at least a first layer and a second layer arranged in a stack and means for heating and/or cooling the first and second layers to form a hot layer and a cold layer wherein the cold layer has a lower temperature than the hot layer; and,
at least one through hole in the stack;
wherein:
a surface of each hot layer is exposed in an interior of the through hole; and
a surface of each cold layer is exposed in the interior of the through hole;
and wherein:
an entire length of the through hole is up to 10 times of a mean free path of a gas in which the apparatus is immersed and/or is not greater than 1500 nm, wherein the series of stacks are arranged such that the hot layers and cold layers form an alternating stack of hot and cold layers, each hot layer is hotter than the immediately adjacent cold layers, each cold layer is colder than the immediate adjacent hot layers, and at least one through hole is aligned across the stack.

18. The apparatus of claim 17, wherein the through hole has a uniform size along its entire length.

19. The apparatus of claim 18, wherein the through hole has a cross-sectional shape of a circle, a slit or a comb.

20. The apparatus of claim 18, wherein the apparatus has at least 10 through holes per square centimeter and/or a total perimeter length of all the through holes of the apparatus per square centimeter is at least two centimeters.

21. The apparatus of claim 17 in which the diameter of the through hole of each member of the series is progressively different from an upper face to a lower face of the stack.

* * * * *